(12) United States Patent
Liu

(10) Patent No.: US 12,531,013 B2
(45) Date of Patent: Jan. 20, 2026

(54) DISPLAY PANEL AND DISPLAY DEVICE COMPRISING THE SAME

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventor: Shaowei Liu, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 0 days.

(21) Appl. No.: 18/889,410

(22) Filed: Sep. 19, 2024

(65) Prior Publication Data

US 2025/0014512 A1     Jan. 9, 2025

(30) Foreign Application Priority Data

Sep. 26, 2023  (CN) .......................... 202311259920.0

(51) Int. Cl.
 *G09G 3/32* (2016.01)
 *G09G 3/3233* (2016.01)

(52) U.S. Cl.
 CPC ............. *G09G 3/32* (2013.01); *G09G 3/3233* (2013.01); *G09G 2300/0426* (2013.01); *G09G 2320/0233* (2013.01)

(58) Field of Classification Search
 CPC .................. G09G 3/32; G09G 3/3233; G09G 2300/0426; G09G 2320/0233
 See application file for complete search history.

(56) References Cited

U.S. PATENT DOCUMENTS

| | | | |
|---|---|---|---|
| 2021/0065625 A1* | 3/2021 | Wang | H10K 59/35 |
| 2022/0093036 A1* | 3/2022 | Im | H01L 23/4985 |
| 2022/0102421 A1 | 3/2022 | Yang et al. | |
| 2023/0263027 A1* | 8/2023 | Du | H10K 59/121 257/40 |

FOREIGN PATENT DOCUMENTS

CN          112151592 B      10/2022

* cited by examiner

*Primary Examiner* — Michael A Faragalla
(74) *Attorney, Agent, or Firm* — KILPATRICK TOWNSEND & STOCKTON LLP

(57) ABSTRACT

A display panel and a display device including the same. The display panel comprising: a first region, a second region, and a transition region disposed between the first region and the second region. Light transmittance of the first region is greater than that of the second region. The display panel comprises: multiple first driving circuits and multiple second driving circuits, each of which are disposed in the transition region and arranged in an array along a first direction and a second direction which are not parallel. A distance between a center of one of first driving circuits and a center of the first region is smaller than a distance between a center of one of second driving circuits, which are connected to a same gate-signal line as the first driving circuits, and the center of the first region.

20 Claims, 21 Drawing Sheets

DISPLAY PANEL AND DISPLAY DEVICE COMPRISING THE SAME

This application claims priority to Chinese Patent Application No. 202311259920.0, titled "DISPLAY PANEL AND DISPLAY DEVICE", filed on Sep. 26, 2023 with the China National Intellectual Property Administration, which is incorporated herein by reference in its entirety.

FIELD

The present disclosure relates to the field of display technology, and in particular to a display panel and a display device.

BACKGROUND

An increasingly high requirement are imposed the screen-to-body ratio with rapid development of electronic devices. Hence, growing attention in the field has been attracted toward full-screen displays of electronic devices.

Usually, a photosensitive sensor is buried into a screen, and wiring and pixel arrangement in a corresponding region is adjusted and the region is capable of display and not opaque. In one embodiment, an electronic device can have a full-screen display as well as a photosensitive function. For example, fingerprint recognition or a front-facing camera can be implemented in the display region.

SUMMARY

A display panel and a display device are provided according to embodiments of the present disclosure. More wiring space is provided for data lines.

In one embodiment, a display panel is provided according to an embodiment of the present disclosure. The display panel comprises a first region, a second region, and a transition region located between the first region and the second region. Light transmittance of the first region is greater than the light transmittance of the second region. The display panel comprises: multiple first driving circuits, which are disposed in the transition region and arranged in an array along a first direction and a second direction which are not parallel; and multiple second driving circuits, which are disposed in the second region and arranged in another array along the first direction and the second direction. One or more first driving circuits of the multiple first driving circuits and one or more second driving circuits of the multiple driving circuits are electrically connected to a same gate-signal line. Along the second direction, a distance between a center of a first driving circuit of the one or more first driving circuits and a center of the first region is smaller than a distance between a center of a second driving circuit of the one or more second driving circuits and the center of the first region.

In one embodiment, a display device is provided according to an embodiment of the present disclosure. The display device comprises a display panel in the embodiments. The display panel comprises a first region, a second region, and a transition region located between the first region and the second region. Light transmittance of the first region is greater than the light transmittance of the second region. The display panel comprises: multiple first driving circuits, which are disposed in the transition region and arranged in an array along a first direction and a second direction which are not parallel; and multiple second driving circuits, which are disposed in the second region and arranged in another array along the first direction and the second direction. One or more first driving circuits of the multiple first driving circuits and one or more second driving circuits of the multiple driving circuits are electrically connected to a same gate-signal line. Along the second direction, a distance between a center of a first driving circuit of the one or more first driving circuits and a center of the first region is smaller than a distance between a center of a second driving circuit of the one or more second driving circuits and the center of the first region.

BRIEF DESCRIPTION OF THE DRAWINGS

Embodiments of the present disclosure would become apparent in non-limiting embodiments described hereinafter in conjunction with drawings. Same or similar reference signs in the drawings may denote same or similar features. Components in the drawings may not be drawn to scale.

Figure 1:
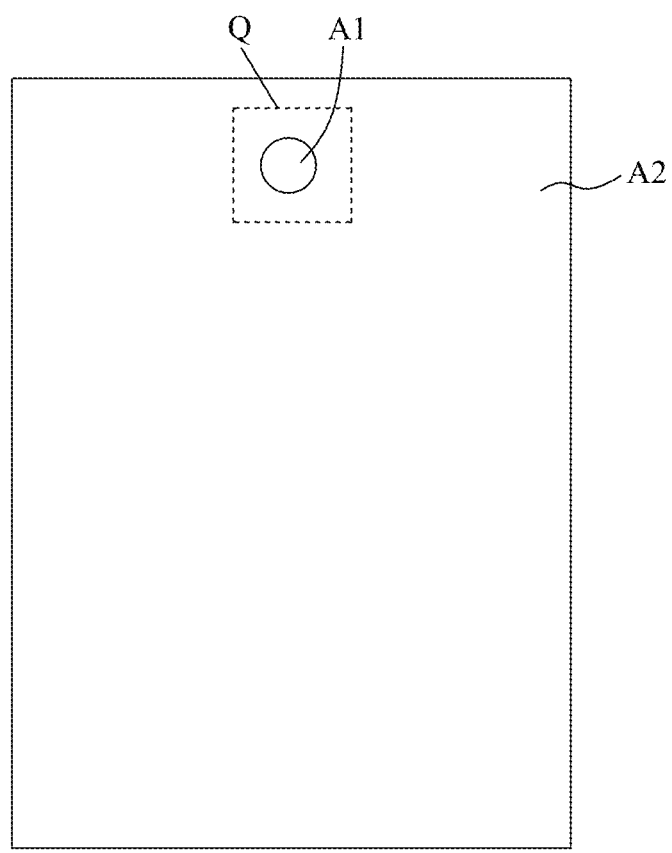
FIG. 1 is a schematic structural diagram of a display panel according to an embodiment of the present disclosure.

| Reference numerals: | |
|---|---|
| 1: display panel; | A1: first region; |
| A2: second region; | A3: transition region; |
| A31: first transition region; | A32: second transition region; |
| X: first direction; | Y: second direction; |
| 11: first driving circuit; | 111: first output terminal; |
| 1111: first output sub-terminal; | 1112: second output sub-terminal; |
| 112: first connection portion; | 113: second output terminal; |
| 21: second driving circuit; | 30: gate-signal line; |
| 40: data line; | 51: first light-emitting element; |
| 511: input terminal; | 62: second connection portion; |
| 63: third connection portion; | 2: display device. |

DETAILED DESCRIPTION OF EMBODIMENTS

Hereinafter features and exemplary embodiments of the present disclosure would be described in detail. In order to clarify purposes, embodiments of the present disclosure, the present disclosure would be described in conjunction with the drawings and embodiments. The embodiments described herein are only intended for explaining the present disclosure and not for limiting the present disclosure. The present disclosure may be practiced without some of details as follows. Description of following embodiments merely illustrates examples for facilitating understanding of the present disclosure.

The relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

When describing a structure of components, one layer or region being "on" or "over" another layer or region may indicate that the former is directly on the latter or there is a third layer or region between the two, and that the former may be "under" or "below" the latter in a case that the structure is flipped.

Herein the term "and/or" describes a relationship between associated objects and indicates three possible relationships. For example, "A and/or B" may refer to that there is only A, there are both A and B, and there is only B. In addition, the symbol "/" usually indicates an "or" relationship between the associated objects.

The term "connection" may refer to "electrical connection" or "electrical connection without an intermediate transistor". The term "insulation" may refer "electrical insulation" or "electrical isolation". The term "driving" may refer to "controlling" or "operating". The term "a part of" may refer to "partial". The term "pattern" may refer to "layout". The term "terminal" may refer to "end" or "edge". The display panel may be a display device, or may be a module or a part of a display device.

Various modifications and changes may be made to the present disclosure without departing from the spirit or the scope of the present disclosure. Thus, the present disclosure is intended for covering modifications and variations made thereto, which fall within the scope of the corresponding claims (embodiments as claimed) and their equivalents. Embodiments of the present disclosure can be combined as long as they do not contradict with each other.

Hereinafter problems of the conventional technology are first introduced before illustrating embodiments of the present disclosure, in order to facilitate understanding of the embodiments.

A display panel of a full-screen display device comprises a photosensitive region, a display region, and a transition region between the photosensitive region and the display region. A photosensitive device is buried in the display panel at a position within the photosensitive region. During usage of the display panel, images should be presented in both the photosensitive region and the display region, to implement the full-screen display.

The photosensitive region shall meet a requirement on light transmittance in a design of the display panel. Thus, driving circuits for driving light-emitting elements in the photosensitive region are arranged in the transition region, and data lines connecting different driving circuits are also arranged in the transition region. In conventional technology, wiring space for arranging the data lines is inadequate.

A display panel and a display device are provided by embodiments of the present disclosure, which can address the above issue. Hereinafter embodiments of the present disclosure are described in detail in conjunction with the drawings.

Figure 2:
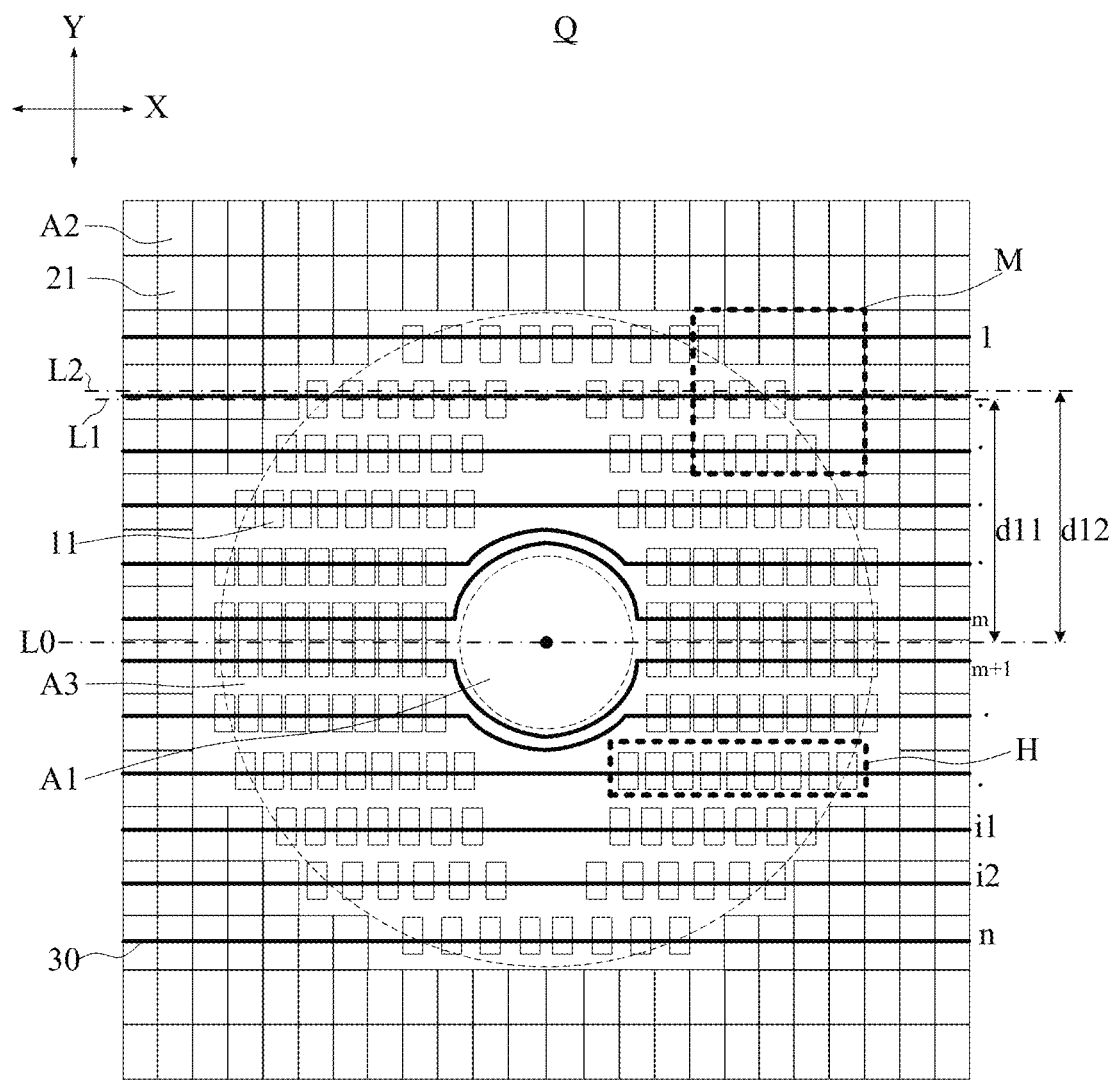
FIG. 2 is a schematic diagram of an enlarged view of region Q as shown in FIG. 1 according to an embodiment of the present disclosure.
Figure 3:
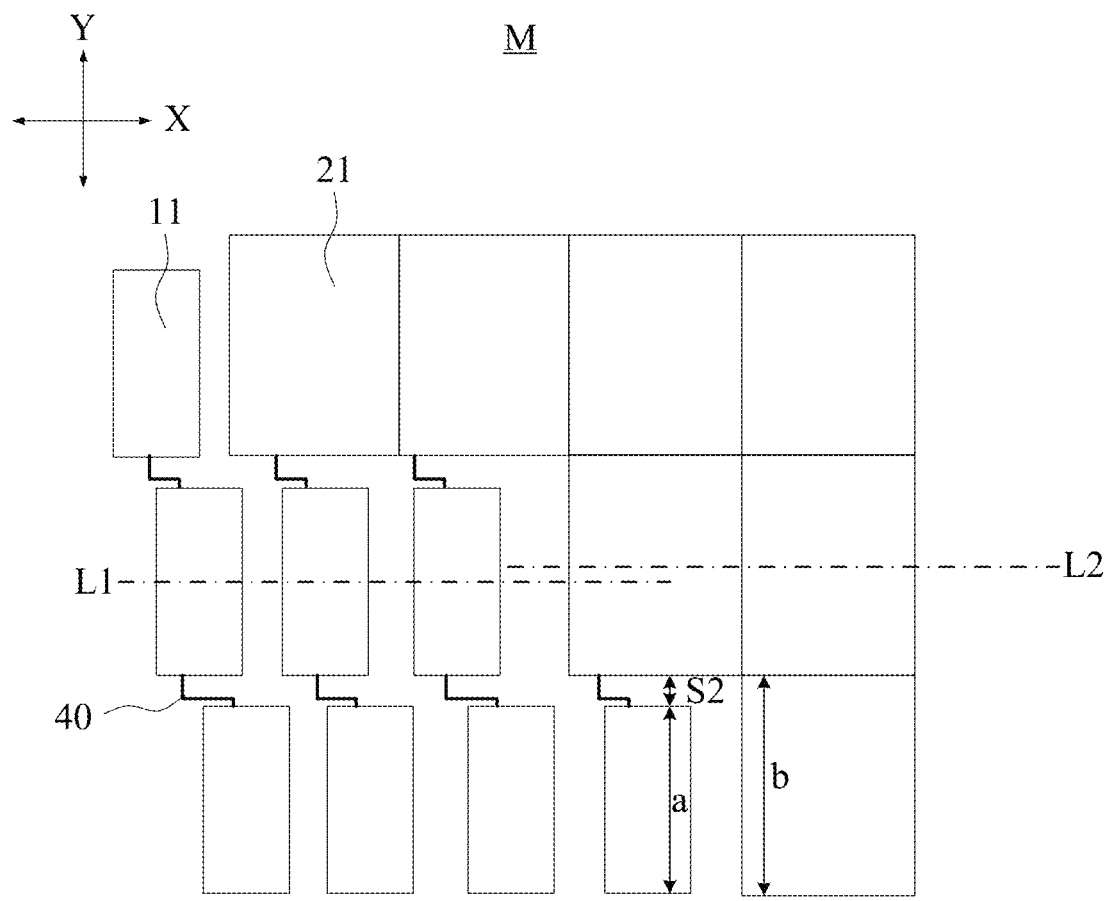
FIG. 3 is a schematic diagram of an enlarged view of region M as shown in FIG. 2 according to an embodiment of the present disclosure.

Reference is made to FIGS. 1 to 3. In an embodiment, a display panel 1 comprises a first region A1, a second region A2, and a transition region A3 located between the first region A1 and the second region A2. Light transmittance of the first region A1 is greater than that of the second region A2.

The display panel 1 comprises multiple first driving circuits 11, multiple second driving circuits 21, and multiple gate-signal lines 30.

The multiple first driving circuits 11 are located in the transition region A3, and are arranged in an array along the first direction X and the second direction Y. The first direction X is not parallel with the second direction Y.

The multiple second driving circuits 21 are located in the second region A2, and are arranged in another array along the first direction X and the second direction Y.

One or more first driving circuits 11 and one or more second driving circuit 21 are electrically connected to the same gate-signal line 30. Along the second direction Y, a distance between a center of each of the one or more first driving circuits 11 and a center of the first region A1 is equal to d11, and a distance between a center of each of the one or more second driving circuits 21 and the center of the first region A1 is equal to d12. There is d11<d12.

In an embodiment, the first region A1 corresponds to a photosensitive region of the display panel 1, and the second region A2 corresponds to a main region, which is responsible for implementing a display function, of the display panel 1. The display panel 1 may comprise a photosensitive device, such as a camera, in the first region A1, and may comprise light-emitting elements in both the first region A1 and the second region A2, to implement the full-screen display. Dimensions and shapes of the first region A1 and the second region A2 are not limited herein. For example, the first region A1 may be circular, drop-shaped, or the like.

The transition region A3 surrounds the first region A1. A size and a shape of the transition region A3 is also not limited herein. For example, an outer contour of the transition region A3 may be circular At least a part of the first driving circuits 11 and a part of the gate-signal lines 30 are disposed in the transition region A3, and light transmittance of the first region A1 is improved to ensure a photosensitivity requirement on the display panel 1. The first driving circuit 11 is configured to drive the light-emitting element(s), which are in the transition region A3 or the first region A1, to achieve the full-screen display. The second driving circuit 21 is configured to drive the light-emitting element(s) in the second region A2.

The gate-signal lines 30 include, but are not limited to, a scanning line configured to provide a scanning signal and a light-control signal line configured to provide a light-control signal.

The first driving circuits 11 located in the same row may be electrically connected to the same gate-signal line 30. The second driving circuits 21 located in the same row may be electrically connected to the same gate-signal line 30.

In FIG. 2, the center of the first region A1 is indicated by a black dot, and a virtual reference line L0 passing through the center of the first region A1 extends along the first direction X. In FIGS. 2 and 3, a first virtual center line L1 passes through centers of first driving circuits 11, and a second virtual center line L2 passes through centers of second driving circuits 21. The first virtual center line L1 and the second virtual center line L2 are parallel, and both extend along the first direction X. As an example, the virtual reference line L0 is a symmetry axis of the first region A1. In FIG. 2, each first driving circuit 11 is represented by a rectangular box, and a dimension of the rectangular box may be determined according to an actual situation. In an embodiment, the rectangular box needs to cover at least 90% of an area of the corresponding first driving circuit 11. Similarly, each second driving circuit 21 may also represented by a rectangular box, even if it is not of a regular shape such as a rectangle. The center of the first driving circuit 11 may be a center of its corresponding rectangular box, and the center of the second driving circuit 21 may be the center of its corresponding rectangular box. The first virtual center line L1 may be a symmetry axis of rectangular boxes corresponding to the first driving circuits 11, and the second virtual center line L2 may be a symmetry axis of rectangular boxes corresponding to the second driving circuit 21. Among the first driving circuit(s) 11 and the second driving circuit(s) 21 electrically connected to the same gate-signal line 30, the first virtual center line L1 is closer to the virtual reference line L0 than the second virtual center line L2 along the second direction Y since there is d11<d12.

Accordingly, among the first driving circuits 11 and the second driving circuits 21 that are electrically connected to the same gate-signal line 30, the center of each first driving circuit 11 is shifted toward the center of the first region A1 with respect to the center of each second driving circuit 21.

For example, as shown in FIG. 2, the transition region A3 is divided into an upper half and a lower half by the virtual reference line L0. The shifting of the first driving circuits 11 is downward in the upper half, and is upward in the lower half.

As shown in FIG. 3, the display panel may further comprise data lines 40. The data line 40 extending across the transition region A3 may be electrically connect to first driving circuit(s) 11 and second driving circuit(s) 12. Along the second direction Y, a distance between a first driving circuit 11 and its neighboring second driving circuit 21 is equal to S2.

Figure 4:
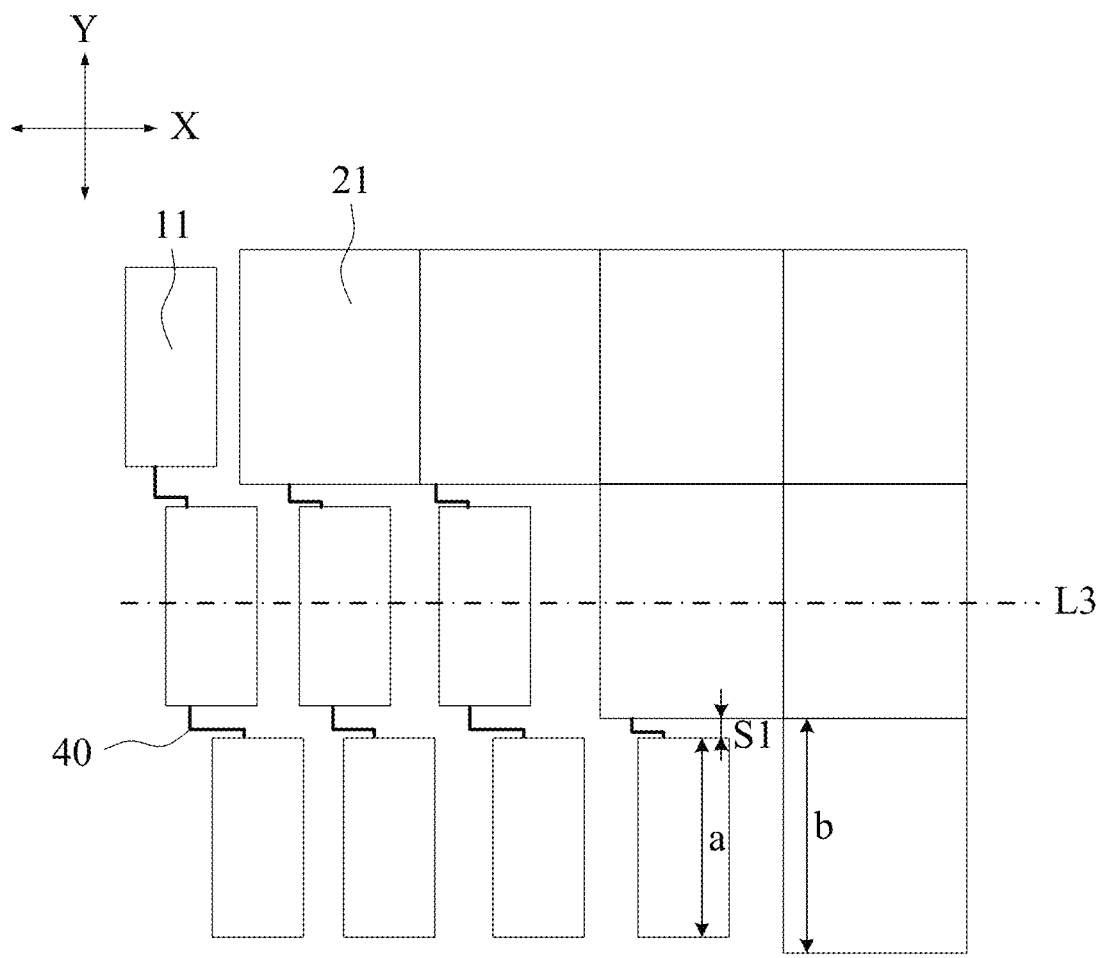
FIG. 4 is a schematic diagram of a comparative structure with respect to a structure as shown in FIG. 3.

A comparative structure as shown in FIG. 4 is provided for better understanding of beneficial effects of embodiments of the present disclosure. The structure as shown in FIG. 4 is basically identical to that as shown in FIG. 3, and a difference lies in that the centers of the first driving circuits 11 are aligned with those of the second driving circuits 21 electrically connected to the same gate-signal line 30 along the first direction X. That is, among first driving circuit(s) 11 and second driving circuit(s) 21 that are electrically connected to the same gate-signal line 30, the distance between the center of each first driving circuit 11 and the center of the first region A1 is equal to the distance between the center of the second driving circuit 21 and the center of the first region A1 along the second direction Y. For example, there is a third virtual center line L3 extending along the first direction X and passing through the centers of the first driving circuits 11 and the centers of the second driving circuits 21. In FIG. 4, along the second direction Y, a distance between the first driving circuit 11 and its neighboring second driving circuit 21 is S1. In FIG. 4, each first driving circuit 11 and each second driving circuit 21 is represented by a rectangular box. The third virtual center line L3 is a symmetry axis of the rectangular boxes corresponding to the first driving circuits 11, and is also a symmetry axis of the rectangular boxes corresponding to the second driving circuits 21.

The first driving circuit 11 and the second driving circuit 21 neighboring along the second direction Y are electrically connected to the same data line 40. In FIG. 4, the centers of the first driving circuits 11 are aligned with those of the second driving circuits 11 electrically connected to the same gate-signal line 30 along the first direction X, which results in the small distance S1 between the first driving circuit 11 and the neighboring second driving circuit 21. Hence, there is insufficient wiring space along the second direction Y for the data line 40 electrically connected to the first driving circuit 11 and the second driving circuit 21.

Herein the centers of the first driving circuits 11 are closer to the center of the first region A1 than the centers of the second driving circuits 21 electrically connected to the same gate-signal line 30, which leads to the increased distance S2 between the first driving circuit 11 and its neighboring second driving circuit 21 along the second direction Y. Hence, the wiring space along the second direction Y for the data line 40 electrically connected to the first driving circuit 11 and the second driving circuit 21 is increased.

In one embodiment, the multiple first driving circuits 11 connected to the same data line 40 may not be aligned with each other in the second direction Y. The data line 40 may have a portion extending along the first direction X. Since the wiring space along the second direction Y for the data lines 40 are increased herein, a larger portion extending along the first direction X can be accommodated in the data line 40.

Figure 5:
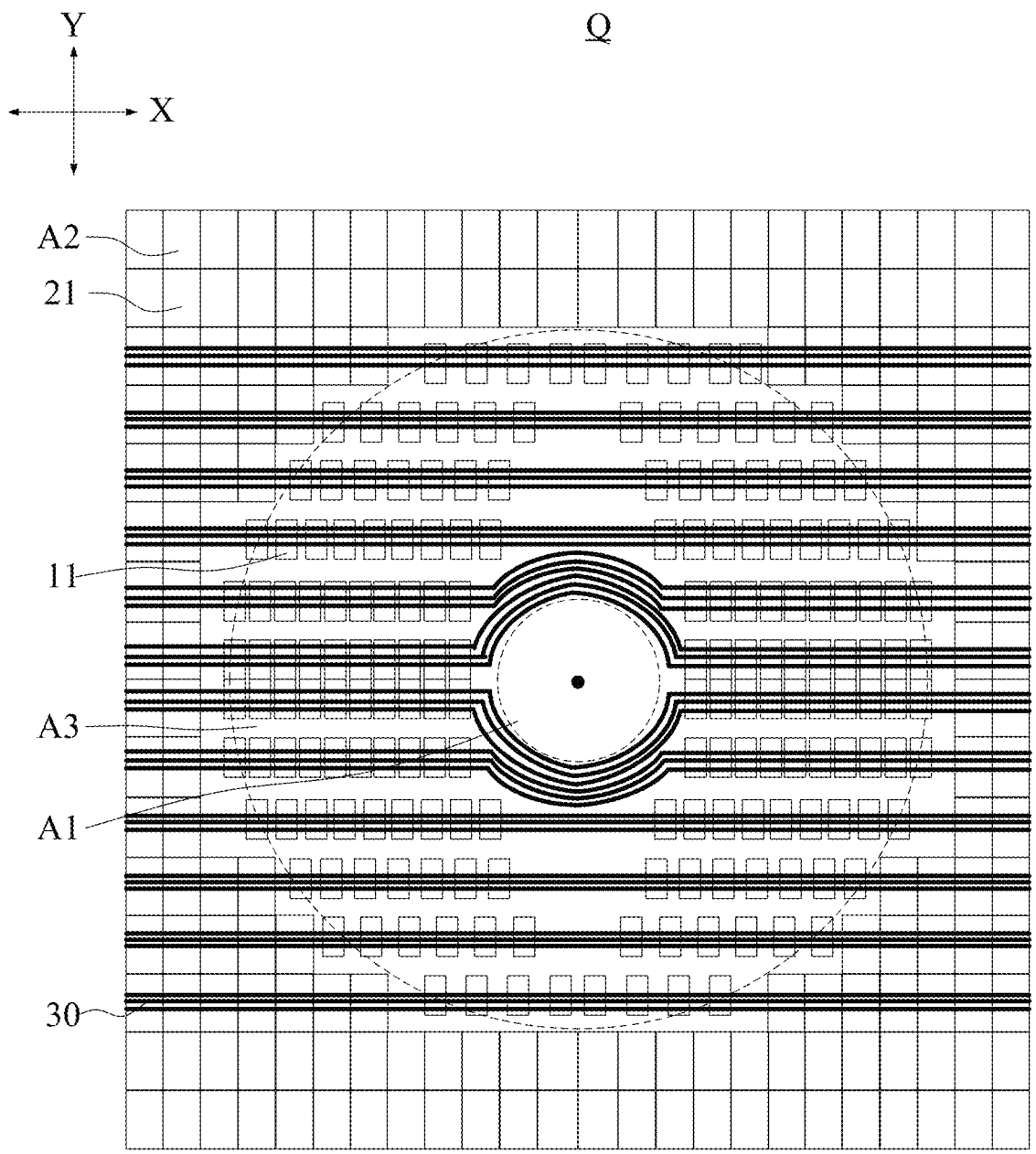
FIG. 5 is a schematic diagram of an enlarged view of region Q as shown in FIG. 1 according to another embodiment of the present disclosure.

The multiple first driving circuits 11 in the same row may be connected to only one gate-signal line 30, or may be connected to multiple gate-signal lines 30. The case of being connected to only one gate-signal line 30 is as shown in FIG. 2, and the case of being connected to multiple gate-signal lines 30 is as shown FIG. 5.

In some embodiments, a length of the first driving circuit 11 is smaller than that of the second driving circuit 21 along the second direction Y, and/or a length of the first driving circuit 11 is smaller than that of the second driving circuit 21 along the first direction X.

Generally, the transition region A3 should be as small as possible, to reduce an impact of the transition region A3 and improve a display effect of the display panel. Thus, a size of the first driving circuit 11 may be limited herein to reduce the size of the transition region A3. The length of the first driving circuit 11 smaller than that of the second driving circuit 21 can reduce an area occupied by the transition region A3 and hence improve the display effect.

As an example, as shown in FIG. 2, neighboring second driving circuits 21 in the second region A2 may abut against each other, or substantially abut against each other, to increase a density of pixels in the display panel. For example, when the second driving circuits 21 are represented by the rectangular boxes, two second driving circuits 21 neighboring along the first direction X may have overlapped edges, and/or two second driving circuits 21 neighboring along the second direction Y may have overlapped edges.

In some embodiments, as shown in FIG. 3, the length of the first driving circuit 11 along the second direction Y is equal to a, the length of the second driving circuit 21 along the second direction is equal to b, and there is a<b. Among the first driving circuits 11 and the second driving circuits 21 that are electrically connected to the same gate-signal line, there is 0<d12−d11≤(b−a)/2. It is appreciated that d12−d11+(b−a)/2=S2, that is, (b−a)/2<S2≤b−a.

The first driving circuit 11 in the upper half of the transition region A3 is taken as an example. When S2 is equal to b−a, the first driving circuits 11 can be shifted downward to a most extent at which the first driving circuits 11 and the second driving circuits 21 that are electrically connected to the same gate-signal line 30 are aligned with each other with respect to their lower edges. The first driving circuit 11 in the lower half of the transition region A3 is taken as another example. When S2 is equal to b−a, the first driving circuits 11 can be shifted upward to a most extent at which the first driving circuits 11 and the second driving circuits 21 that are electrically connected to the same gate-signal line 30 are aligned with each other with respect to their upper edges.

As shown in FIG. 2, first circuit rows H are arranged sequentially as the $1^{st}$ row to the $n^{th}$ row along the second direction Y in the transition region A3. In FIG. 2, the first circuit rows H are numerically indicated from the $1^{st}$ row to the $n^{th}$ row. The first circuit row H may comprise multiple first driving circuits 11 arranged sequentially along the first direction X, and multiple first circuit rows H are arranged along the second direction Y. The $m^{th}$ row and the $(m+1)^{th}$ row of the first circuit rows H are adjacent to each other, and are closest to the first region A1 along the second direction Y among the first circuit rows H.

The $m^{th}$ first circuit row in the upper half of the transition region A3 may be shifted downward, while the $(m+1)^{th}$ first circuit row in the lower half of the transition region A3 may be shifted upward. A maximum degree of the shifting is that a lower edge of the $m^{th}$ first circuit row in the upper half of the transition region A3 abuts against an upper edge of the $(m+1)^{th}$ first circuit row in the lower half of the transition region A3.

Figure 6:
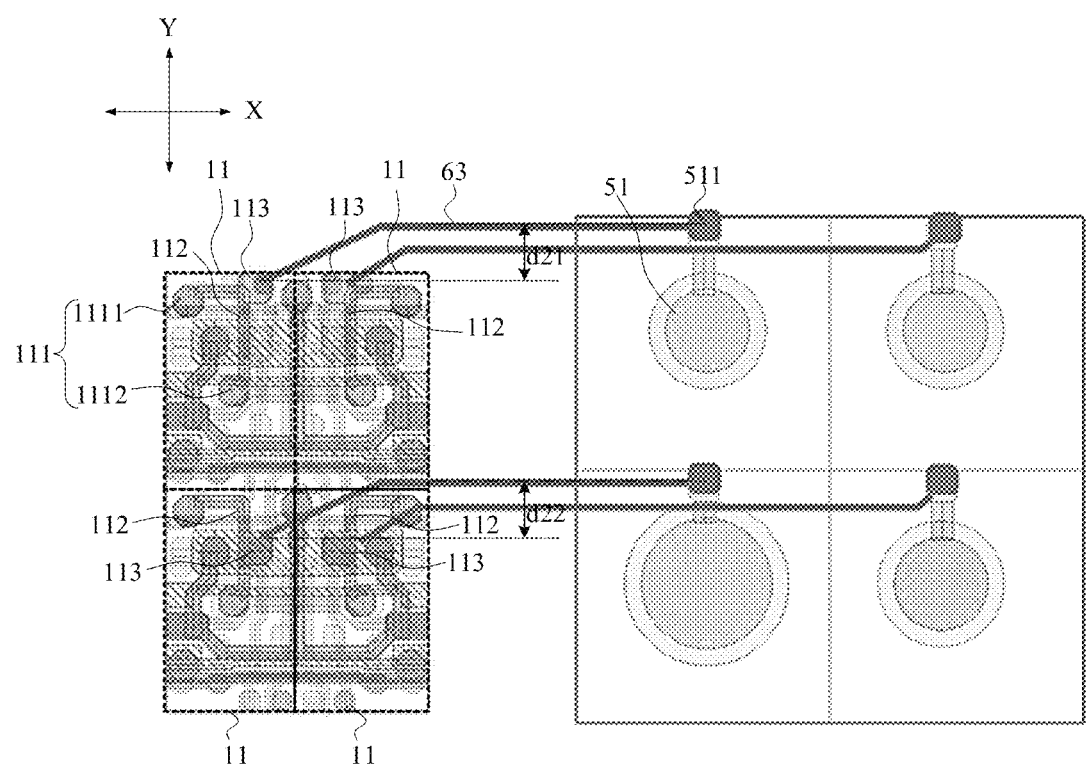
FIG. 6 is a schematic diagram of a layout of a region in a display panel according to an embodiment of the present disclosure.
Figure 7:
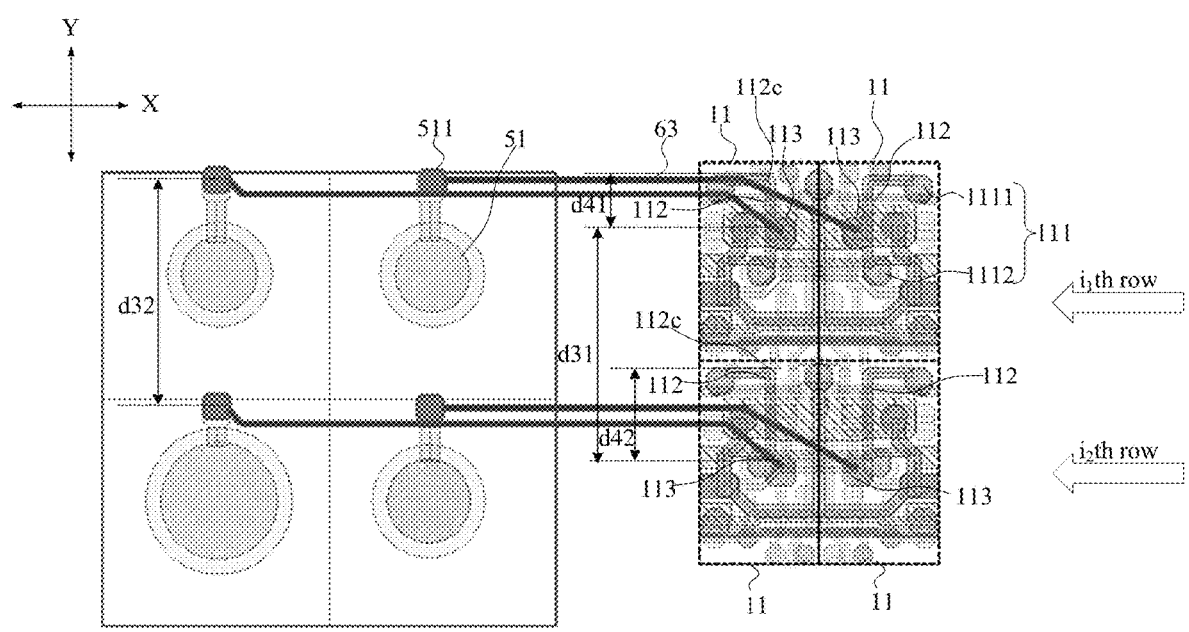
FIG. 7 is a schematic diagram of a schematic diagram of a layout of a region in a display panel according to another embodiment of the present disclosure.

In some embodiments, as shown in FIGS. 6 and 7, the first driving circuit 11 may comprise a first output terminal 111 and a first connection portion 112 that are connected to each other. At least a portion of the first connection portion 112 extends along the second direction Y. The first connection portion 112 comprises a second output terminal 113. The first region A1 comprises a first light-emitting element 51, the first light-emitting element 51 comprises an input terminal 511, and the second output terminal 113 is electrically connected to the input terminal 511. In one embodiment, the second output terminal 113 may be electrically connected to the input terminal 511 via a third connection portion 63.

The second output terminal 113 may be disposed on the first connection portion 112. Since the first connection portion 112 comprises the portion extending along the second direction Y, the first connection portion 112 may serve as a "slide rail" along which the second output terminal 113 can be freely positioned at the portion along the second direction Y. In one embodiment, wiring space along the second direction Y for the third connection portion 63 can be guaranteed.

Reference is made to FIG. 2 in conjunction with FIGS. 6 and 7. As shown in FIG. 2, the transition region A3 is divided into the upper half and the lower half by the virtual reference line L0. In FIG. 6, it is taken as an example that the first driving circuits 11 are located in the upper half of the transition region A3, and the second output terminal 113 may be located at an upper portion of the corresponding first connection portion 112. In FIG. 7, it is taken as an example that the first driving circuits 11 are located in the lower half of the transition region A3, and the second output terminal 113 may be located at a lower portion of the corresponding first connection portion 112.

FIG. 6 and FIG. 7 each illustrates a total of four first driving circuits 11, which are arranged as 2 rows and 2 columns. In addition, each first driving circuit 11 may not have a regular shape, such as a rectangle, and in such case the first driving circuits 11 can still be represented by the rectangular boxes as shown in FIG. 6 or FIG. 7. A size of the rectangular box may be determined according to an actual situation. In one embodiment, the rectangular box needs to cover at least 90% of an area occupied by the corresponding first driving circuit 11. Similarly, each second driving circuit 21 may not have a regular shape, and may be represented by a rectangular box. The center of the first driving circuit 11 may be the center of its corresponding rectangular box, and the center of the second driving circuit 21 may be the center of its corresponding rectangular box. In addition, an edge of the first driving circuit 11 may be an edge of its corresponding rectangular box, and an edge of the second driving circuit 21 may be an edge of its corresponding rectangular box.

In one embodiment, the first light-emitting element 51 may comprise an organic light-emitting diode (OLED). The first light-emitting element 51 may comprise an anode and a cathode. The input terminal 511 of the first light-emitting element 51 may be connected to the anode of the first light-emitting element 51.

In one embodiment, the first driving circuit 11 may provide a driving current and/or an initialization signal to the input terminal 511 of the first light-emitting element 51 via the first output terminal 111 and the first connection portion 112. The driving current may be configured to drive the first light-emitting element 51 for light emission. The initialization signal may be configured to initialize a potential at the anode of the first light-emitting element 51.

In some embodiments, as shown in FIG. 2, multiple first driving circuits 11 are arranged sequentially along the first direction X to form one first circuit row H. The first circuit rows H are arranged sequentially as the $1^{st}$ row to the $n^{th}$ row along the second direction Y. Reference is made to FIG. 2 in conjunction with FIG. 6. Along the second direction Y, a distance between the second output terminal 113 in the kth first circuit row H and the input terminal 511 of the first light-emitting element 51 electrically connected to such second output terminal 113 is equal to d21, and a distance between the second output terminal 113 in the $s^{th}$ first circuit row H and the input terminal 511 of the first light-emitting element 51 electrically connected to such second output terminal 113 is equal to d22. There is d21=d22, and n, k, and s are arbitrary integers satisfying 1≤k≤n, 1≤s≤n, and k≠s.

Along the second direction Y, the distance between the second output terminal 113 and the input terminal 511 of the first light-emitting element 51 electrically connected to such second output terminal 113 affects the wiring space for the third connection portion 63. In a case that such distances are different among different first circuit rows H, the third connection portions 63 have different wiring space along the second direction Y among the different first circuit rows H. Wiring of the third connection portions 63 tends to be non-uniform, which affects display uniformity.

Herein the distance between the second output terminal 113 and the input terminal 511 of the first light-emitting element 51 electrically connected to such second output terminal 113 is kept constant among the different first circuit rows H, and the third connection portions 63 have identical wiring space along the second direction Y among the different first circuit rows H. Wiring of the third connection portions 63 tends to be uniform, which improves display uniformity.

Herein specific values of k, s, and n are not limited. As an example, k and s each may be equal to 1 or any other integer less than or equal to n, and k and s are not equal.

As mentioned above, a position of the second output terminal 113 on the corresponding first connection portions 112 may vary among different first circuit rows H. The position of the second output terminal 113 on the corresponding first connection portion 112 may be adjusted to ensure that the distance between such second output terminal 113 and the input terminal 511 electrically connected thereto is constant among the different first circuit rows H.

In some embodiments, the first driving circuits 11 may comprise the first driving circuit(s) in an $i1^{th}$ row and the first driving circuit(s) in an $i2^{th}$ row. Reference is made to FIG. 2. The first driving circuit(s) in the $i1^{th}$ row may be located in the $i1^{th}$ first circuit row H, and the first driving circuit(s) in the $i2^{th}$ row may be located in the $i2^{th}$ first circuit row H. The $i1^{th}$ first circuit row H and the $i2^{th}$ first circuit row H may be two arbitrary rows among the $1^{st}$ to $n^{th}$ first circuit rows satisfying 1≤i1≤n, 1≤i2≤n, and i1≠i2. Specific values of i1 and i2 are not limited herein. The $i1^{th}$ row and the $i2^{th}$ row may or may not be adjacent rows.

Reference is made to FIG. 7. The first driving circuits in the $i1^{th}$ row are electrically connected to the input terminals 511 of the first light-emitting elements 51 in an $m1^{th}$ row. The first driving circuits in the $i2^{th}$ row are electrically connected to the input terminals 511 of the first light-emitting elements 51 in an $m2^{th}$ row. Along the second direction Y, a distance between the second output terminals 113 of the first driving circuits in the $i1^{th}$ row and the second output terminals 133 of the first driving circuits of the $i2^{th}$ row is equal to d31, and a distance between the input terminals 511 of the first light-emitting elements 51 in the $m1^{th}$ row and the input terminals 511 of the first light-emitting elements 51 in the $m2^{th}$ row is equal to d32. There is d31=d32.

Herein d31=d32 facilitates uniform arrangement of the third connection portions 63 for the first driving circuits in different rows, to improve the display uniformity.

In some embodiments, as shown in FIG. 2, the first driving circuit in the $i1^{th}$ row and the first driving circuit in the $i2^{th}$ row are neighboring along the second direction Y. The second driving circuits 21 comprises second driving circuit(s) in a $j1^{th}$ row and second driving circuit(s) in a $j2^{th}$ row t neighboring along the second direction Y. The first driving circuit(s) in the $i1^{th}$ row and the second driving circuit(s) in the $j1^{th}$ row are electrically connected to the same gate-signal line 30, and the first driving circuit(s) in the $i2^{th}$ row and the second driving circuit(s) in the $j2^{th}$ row are electrically connected to the same gate-signal line 30.

Figure 8:
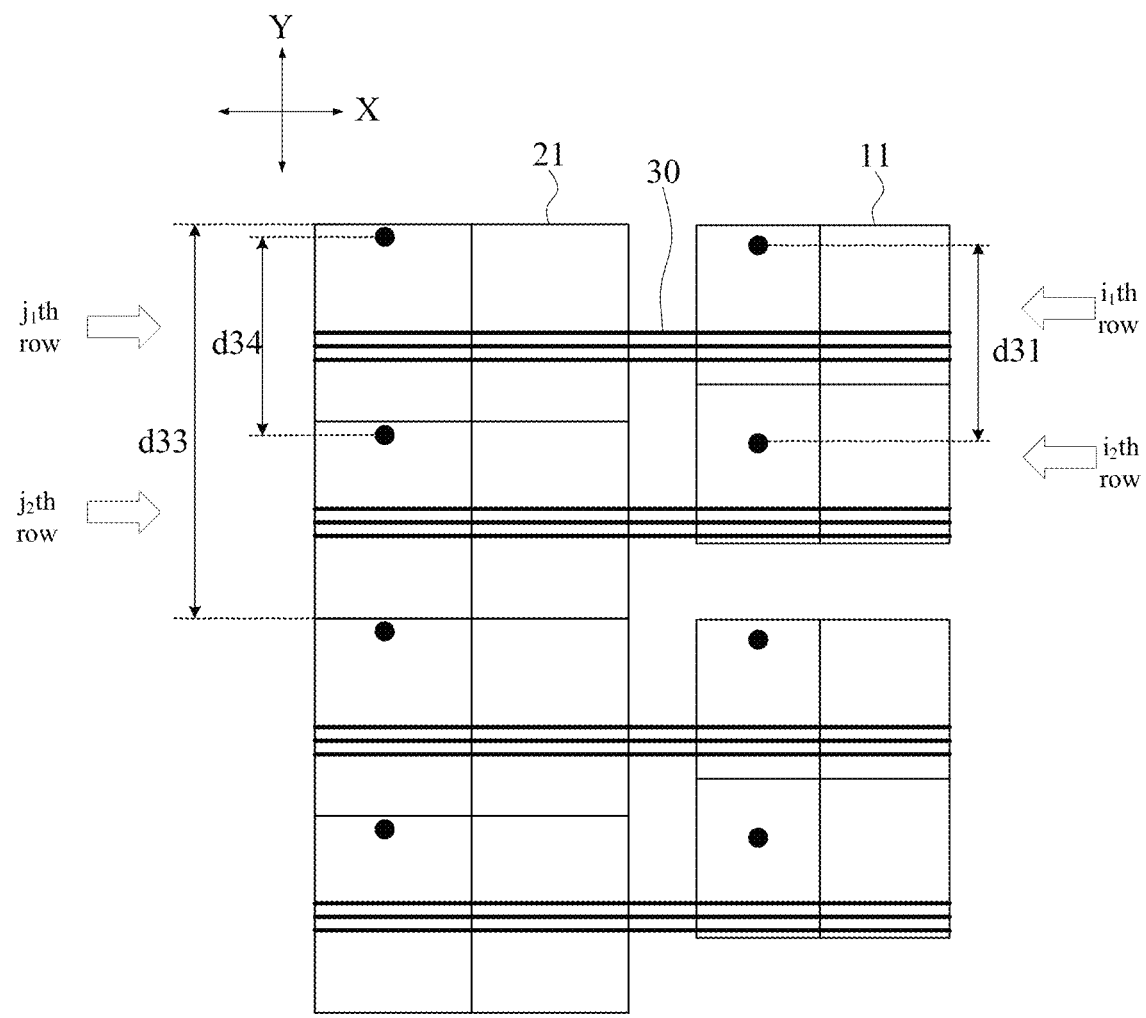
FIG. 8 is a schematic diagram of arrangement of driving circuits in a display panel according to an embodiment of the present disclosure.

In FIG. 8, solid black dots represent the second output terminals of the first driving circuits 11 and the output terminals of the second driving circuits 21.

In one embodiment, the second driving circuit 21 may configured to drive the second light-emitting element for light emission. An output terminal of the second driving circuit 21 is electrically connected to an input terminal of the corresponding second light-emitting element. Along the second direction Y, the distance d31 between the second output terminals 113 of the first driving circuits in the $i1^{th}$ row and the second output terminals 113 of the first driving circuits in the $i2^{th}$ row may be equal to a distance d34 between the output terminals of the second driving circuits in the $j1^{th}$ row and the output terminals of the second driving circuits in the $j2^{th}$ row, and there is d31=d34. In such case, the distance between the output terminals of the first drive circuits in different rows in the transition region is the same as the distance between the output terminals of the second drive circuits in different rows in the second region. Hence, the wiring space between the output terminals of the first driving circuits in different rows in the transition region is consistent with wiring space between the output terminals of the second driving circuit in different rows in the second region. Overall wiring uniformity across the display panel can be improved.

Along the second direction Y, a quantity of wires required to extend along the first direction X is constant between the output terminals of every pair of neighboring second driving circuits 21. As an example, the wires may be the gate-signal line(s) 30. When there is d31=d34, a larger quantity of wirings can be disposed between the output terminals of driving circuits adjacent in the second direction Y, and the overall wiring uniformity can be improved. Thus, the display effect can be improved.

As shown in FIG. 8, a total length of the second driving circuits in the $j1^{th}$ row and the $j2^{th}$ row along the second direction Y is equal to d33. In one embodiment, d31=d34=d33/2.

In one embodiment, the second driving circuit 21 may not comprise a part similar to the first connection portion 112 in the first driving circuit 11.

Reference is made to FIG. 7. In some embodiments, a relative position of the second output terminal 113 on the corresponding first connection portion 112 in the first driving circuit(s) in the $i1^{th}$ row is different from that in the first driving circuit(s) in the $i2^{th}$ row.

The first connection portion 112 comprises a portion extending along the second direction Y. The first connection portion 112 may serve as a "slide rail", along which the second output terminal 113 of the corresponding first driving circuit 11 may be positioned at different locations among different rows. Hence, the foregoing relationship d31=d32 can be guaranteed.

For example, the second output terminal 113 of the first driving circuit 11 in some rows may be close to an upper end of the corresponding first connection portion 112 along the second direction Y. In one embodiment, the second output terminal 113 of the first driving circuit 11 in some rows may be close to an upper end of the corresponding first connection portion 112 along the second direction Y. In one embodiment, the second output terminal 113 of the first driving circuit 11 in some rows may be close to a center of the corresponding first connection portion 112 along the second direction Y.

Reference is made to FIG. 7. In some embodiments, the first driving circuit(s) 11 in the i2$^{th}$ row is located at a side of the first driving circuit(s) 11 in the i1$^{th}$ row away from the center of the first region A1 along the second direction Y. Along the second direction Y, a terminal of the first connection portion 112 close to the center of the first region A1 is called a first terminal 112c. Along the second direction Y, a distance between the second output terminal 113 and the first terminal of each first driving circuit 11 in the i1$^{th}$ row is equal to d41, and a distance between the second output and the first terminal of each first driving circuit 11 in the i2$^{th}$ row is d42. There is d41<d42.

That is, along the second direction Y, the closer the first driving circuit 11 is to the center of the first region A1, the closer its second output end 113 is to the first terminal of its first connection portion 112.

In other words, the relative position of the second output terminal 113 on the corresponding first connection portion 112 varies between different rows of the first driving circuits 11. d41<d42 can guarantee the foregoing relationship d31=d32.

In some embodiments, as shown in FIG. 6 or FIG. 7, a pattern of an orthographic projection of the first connection portion 112 on a light-emitting surface of the display panel may be identical among different first driving circuits 11.

Figure 9:
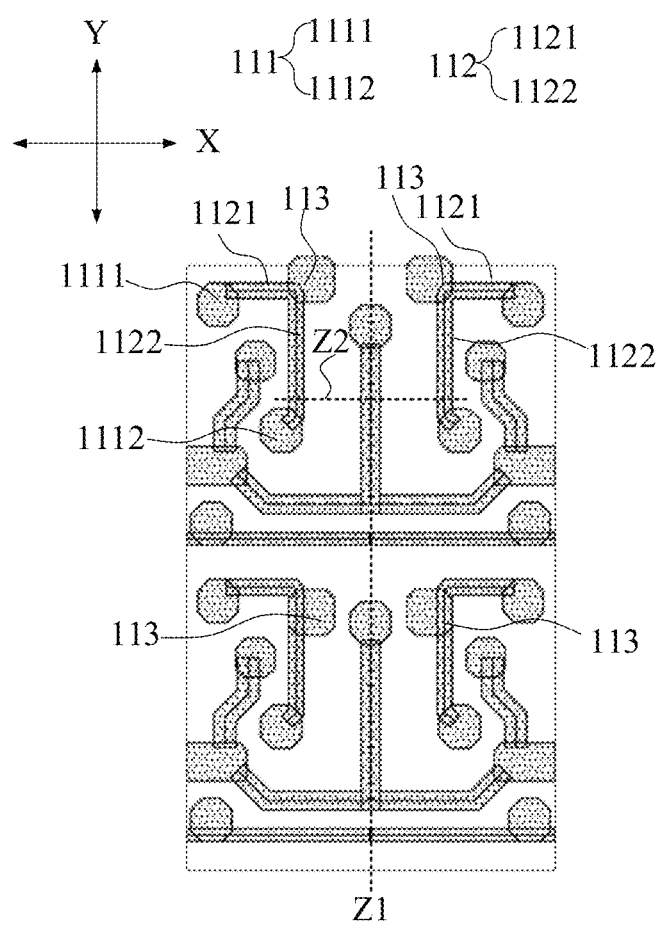
FIG. 9 is a schematic diagram of a layout of a film comprising a first connection portion a display panel according to an embodiment of the present disclosure.

Reference is made to FIG. 9 for a clearer illustration of a pattern and a structure of the first connection portion 112. FIG. 9 shows a structure of a film in which the first connection portion 112 as shown in FIG. 6 is located. As shown in FIG. 9, the orthographic projection of the left first connection portions 112 on the light-emitting surface of the display panel has a pattern roughly like the number "7".

Herein the patterns of the orthographic projections of the first connection portions 112 of different first driving circuits 11 are identical, which facilitates reducing a difficulty of manufacturing the first driving circuits 11 and improves display uniformity.

Reference is further made to FIG. 9. In some embodiments, the first connection portions 112 of two first driving circuits 11 neighboring along the first direction X may be symmetrically configured. As an example, the first connection portions 112 of the two first driving circuits 11 neighboring along the first direction X are symmetrical with respect to a first virtual bisector Z1. Here a segment connecting the centers of the two neighboring first driving circuits in is denoted as a virtual segment Z2, and the first virtual bisector Z1 is a bisector of the virtual segment Z2.

Reference is made to FIG. 6 in conjunction with FIG. 9. As an example, two first driving circuits 11 neighboring along the first direction X are symmetrically configured with respect to the first virtual bisector Z1. That is, patterns of the two neighboring first driving circuits 11 may be mirrored images.

Herein the first connection portions 112 of two first driving circuits 11 neighboring along the first direction X are configured symmetrically, and the two neighboring first driving circuits 11 are also symmetrically configured, and arrangement of the first driving circuits 11 can be more compact. A space occupied by the multiple first driving circuits 11 can be reduced, and a density of pixels can be increased.

Figure 10A:
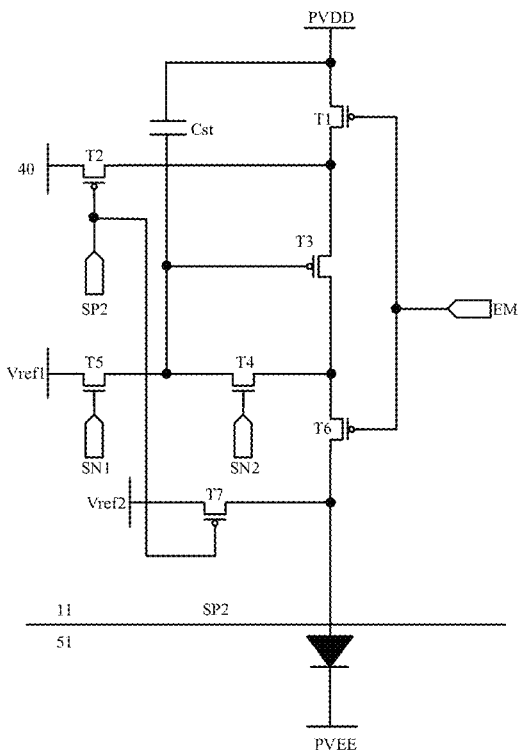
FIG. 10a is a schematic structural diagram of a first driving circuit in a display panel according to an embodiment of the present disclosure.

In some embodiments, as shown in FIG. 10a, the first driving circuit 11 comprises a light-emitting control transistor T6 and an initialization transistor T7. As shown in FIG. 9, the first output terminal 111 comprises a first output sub-terminal 1111 and a second output sub-terminal 1112. The light-emitting control transistor T6 is connected to the first output sub-terminal 1111, and the initialization transistor T7 is connected to the second output sub-terminal 1112. The first connection portion 112 is electrically connected between the first output sub-terminal 1111 and the second output sub-terminal 1112.

In one embodiment, as shown in FIG. 10a, the first driving circuit 11 may further comprise a driving transistor T3, a power feeding transistor T1, a data writing transistor T2, a threshold compensating transistor T4, a reset transistor T5, and a storage capacitor Cst. A structure of the first driving circuit 11 may include, but is not limited to, the structure as shown in FIG. 10a.

The power feeding transistor T1 may be configured to transmit a voltage of a first power line PVDD to a first electrode of the driving transistor T3. The data writing transistor T2 may be configured to write a data signal on data line 40 onto the driving transistor T3. The threshold compensating transistor T4 may be configured to compensate a threshold voltage of the driving transistor T3. The driving transistor T3 may be configured to generate a driving current for driving the first light-emitting element 51 for light emission. The reset transistor T5 may be configured to transmit a reset signal on a reset signal line Vref1 to a gate electrode of the driving transistor T3. The light-emitting control transistor T6 may be configured to select the first light-emitting element 51 to enter a light-emitting stage. The initialization transistor T7 may be configured to transmit an initialization signal Vref2 to the first light-emitting element 51. The storage capacitor Cst may be configured to store charges written into the driving transistor T3.

A gate electrode of the power feeding transistor T1 and a gate electrode of the light-emitting control transistor T6 may be electrically connected to a light-emitting control signal line EM.

A gate electrode of the reset transistor T5 may be electrically connected to a scanning line SN1, and a gate electrode of the threshold compensating transistor T4 may be electrically connected to a scanning line SN2.

A gate electrode of the data writing transistor T2 and a gate electrode of the initialization transistor T7 may be electrically connected to a same scanning line SP2. In the same first driving circuit 11, the gate electrode of the data writing transistor T2 and the gate electrode of the initialization transistor T7 share the same scanning signal.

Figure 10B:
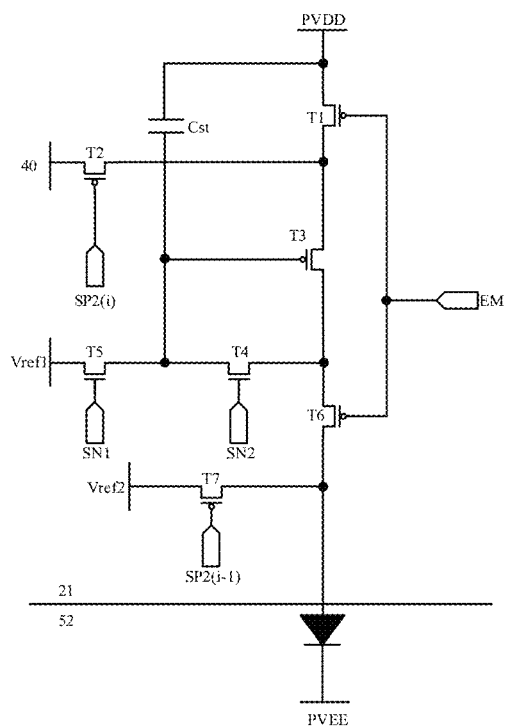
FIG. 10b is a schematic structural diagram of a second driving circuit in a display panel according to an embodiment of the present disclosure.

In one embodiment, as shown in FIG. 10b, the second driving circuit 21 may be configured to drive the second light-emitting element 52. A structure of the second driving circuit 21 may be substantially identical to the structure of the first driving circuit 11, and a different may lie in that the gate electrode of the data writing transistor T2 and the gate electrode of the initialization transistor T7 in the same second driving circuit 21 are connected to different scanning lines. For example, the gate electrode of the data writing transistor T2 of each second driving circuit 21 in the (i-1)$^{th}$ row is connected to a scanning line SP2(i-1), the gate electrode of the data writing transistor T2 of each second driving circuit 21 in the i$^{th}$ row is connected to a scanning line SP2(i), and the gate electrode of the initialization transistor T7 of the second driving circuit 21 in the i$^{th}$ row may be connected to the scanning line SP2(i-1).

In one embodiment, as shown in FIG. 9, the first connection portion 112 comprises a first section 1121 and a second section 1122 that are connected. The first section 1121 extends along the first direction X, and the second section 1122 extends along the second direction Y. The first section 1121 is electrically connected to the first output sub-terminal 1111, and the second section 1122 is electrically connected to the second output sub-terminal 1112.

The first output sub-terminal 1111 is connected to the light-emitting control transistor T6, and the second output sub-terminal 1112 is connected to the initialization transistor T7. The first output sub-terminal 1111 and the second output sub-terminal 1112 are not aligned with each other in the second direction Y. Hence, in a case that the first connection portion 112 comprises only the portion extending along the second direction Y, the first connection portion 112 cannot connect both the first output sub-terminal 1111 and the second output sub-terminal 1112. Herein the first connection portion 112 further comprises the first section 1121 extending along the first direction X, and the first connection portion 112 can connect both the first output sub-terminal 1111 and the second output sub-terminal 1112.

Figure 11:
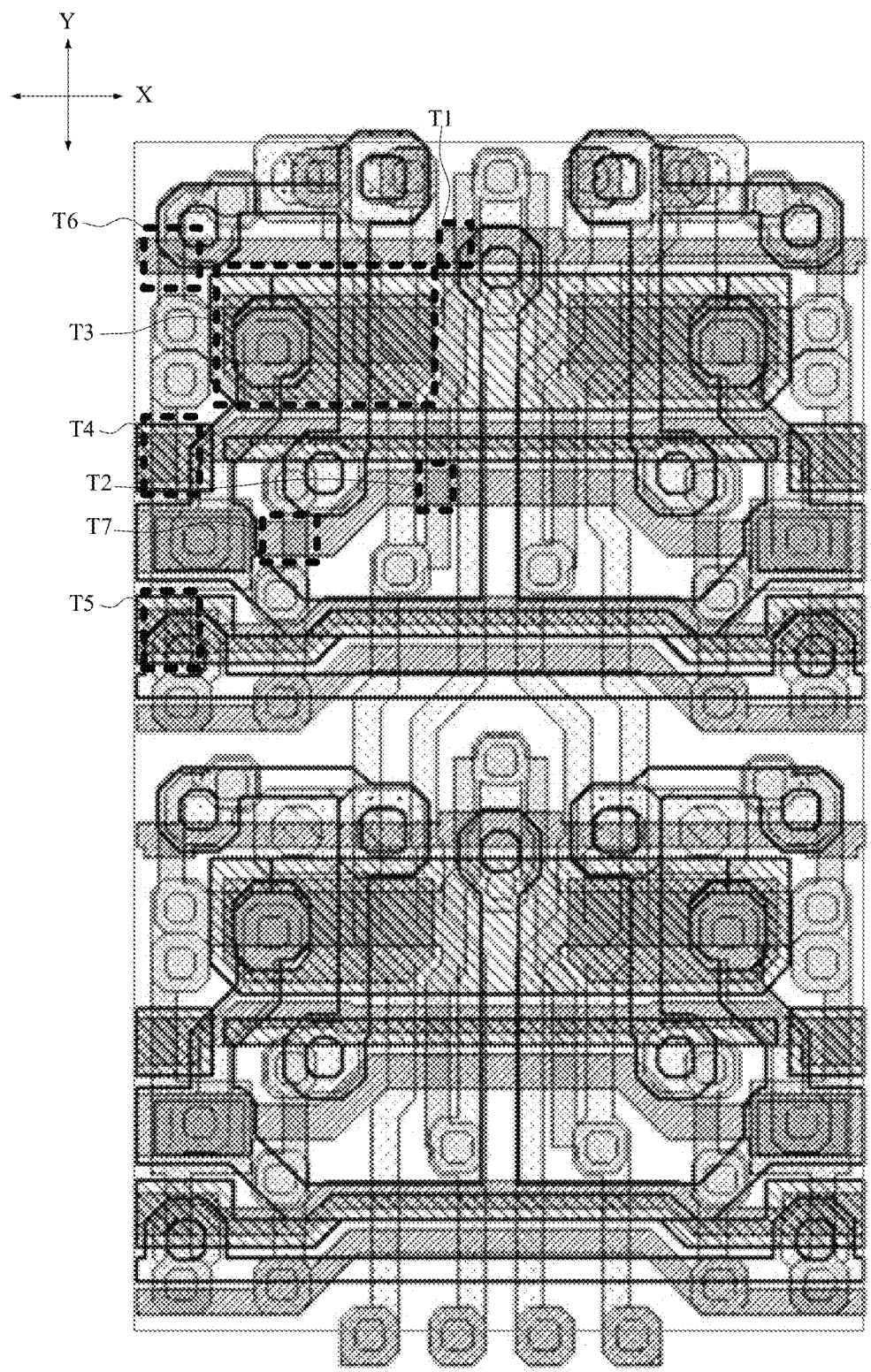
FIG. 11 is a schematic diagram of a layout of a first driving circuit in a display panel according to an embodiment of the present disclosure.

In some embodiments, as shown in FIG. 11, the initialization transistor T7 and the data writing transistor T2 are located at a same side of the driving transistor T3, along the second direction Y, in one first driving circuit 11. Hence, it is convenient to connect the gate electrode of the initialization transistor T7 and the gate electrode of the data writing transistor T2 to the same scanning line SP2.

Along the second direction Y, the initialization transistor T7 and the light-emitting control transistor T6 may be located at opposite sides of the driving transistor T3. For example, along the second direction Y, the initialization transistor T7 is located below the driving transistor T3, while the light-emitting control transistor T6 is located above the driving transistor T3. In one embodiment, there is adequate spacing along the second direction Y for disposing the second section 1122 of the first connection portion 112 between the initialization transistor T7 and the light-emitting control transistor T6. Accordingly, the second output terminal 113 can have more candidate positions.

FIG. 11 merely illustrates a total of four first driving circuits 11 arranged in two rows and two columns.

In some embodiments, the data lines 40 of the display panel are electrically connected to the first driving circuits 11. As shown in FIG. 10a, the data line 40 is electrically connected to the data writing transistor T2 in the first driving circuit 11. The first connection portion 112 and the data line 40 may be located in different films.

Compared with conventional display panels, the first connection portion 112 is added into the first driving circuit 11 according to embodiments of the present disclosure. The first connection portion 112 is connected to the first light-emitting element 51, and hence stability of a potential on the first connection portion 112 affects light-emitting stability of the first light-emitting element 51. Amplitude of the data signal on the data line 40 affects amplitude of a driving current, and the amplitude of the driving current affects luminance of the first light-emitting element 51. Therefore, it is important to reduce parasitic capacitance between the first connection portion 112 and the data line 40, that is, reduce coupling between the two.

Herein the first connection portion 11 and the data line 40 are located in different films, and thus a distance between the two is increased. Hence, the parasitic capacitance between the first connection portion 112 and the data line 40 can be reduced, which weakens the coupling between the two and improves the display effect.

In some embodiments, an insulation layer is inserted between the first connection portion 112 and the data line 40. A thickness of the insulation layer may be greater than or equal to 2 μm. The thick insulation layer between the first connection portion 112 and the data line 40 can lead to good reduction of the parasitic capacitance between the first connection portion 112 and the data line 40. Hence, the coupling between the first connection portion 112 and the data line 40 can be greatly weakened, further improving the display effect.

In some embodiments, as shown in FIG. 10a, the display panel further comprises a power line PVDD, and the power line PVDD is electrically connected to the first driving circuit 11. For example, the power line PVDD may be electrically connected to the first electrode of the power feeding transistor T1 in the first driving circuit 11.

Reference is further made to FIG. 11 in conjunction with FIG. 11a to FIG. 11g. The first driving circuit 11 further comprises the driving transistor T3 and a second connection portion 62. The second connection portion 62 is electrically connected to the gate electrode of the driving transistor T3. The second connection portion 62 may further be electrically connected to the threshold compensating transistor T4 and the reset transistor T5.

The power line PVDD comprises a first branch PVDD1, and the first branch PVDD1 has the same potential as the power line PVDD. An orthographic projection of the first branch PVDD1 on the light-emitting surface of the display panel overlaps at least partially with the orthographic projection of the second connection portion 62 on the light-emitting surface of the display panel.

Since the second connection portion 62 is electrically connected to the gate electrode of the driving transistor T3, a potential on the second connection portion 62 affects amplitude of the driving current, and the amplitude of the driving current affects the luminance of the first light-emitting element 51. Compared with conventional display panels, the first connection portion 112 is added into the first driving circuit 11 according to embodiments of the present disclosure. Hence, how to reduce coupling between the first connection portion 112 and the second connection portion 62 is also crucial.

Here the first branch PVDD1 and the second connection portion 62 are disposed in an overlapping manner. The potential of the first branch PVDD1 is identical to the potential of the power line PVDD, and the potential of the power line PVDD is usually fixed. For example, the power line PVDD may be configured to transmit a constant positive voltage signal. Hence, the first branch PVDD1 can be utilized to eliminate the coupling between the first connection portion 112 and the second connection portion 62.

The structure as shown in each of FIG. 11a to FIG. 11g is located in a single film, and the structures in different figures are located in different films.

Figure 11A:
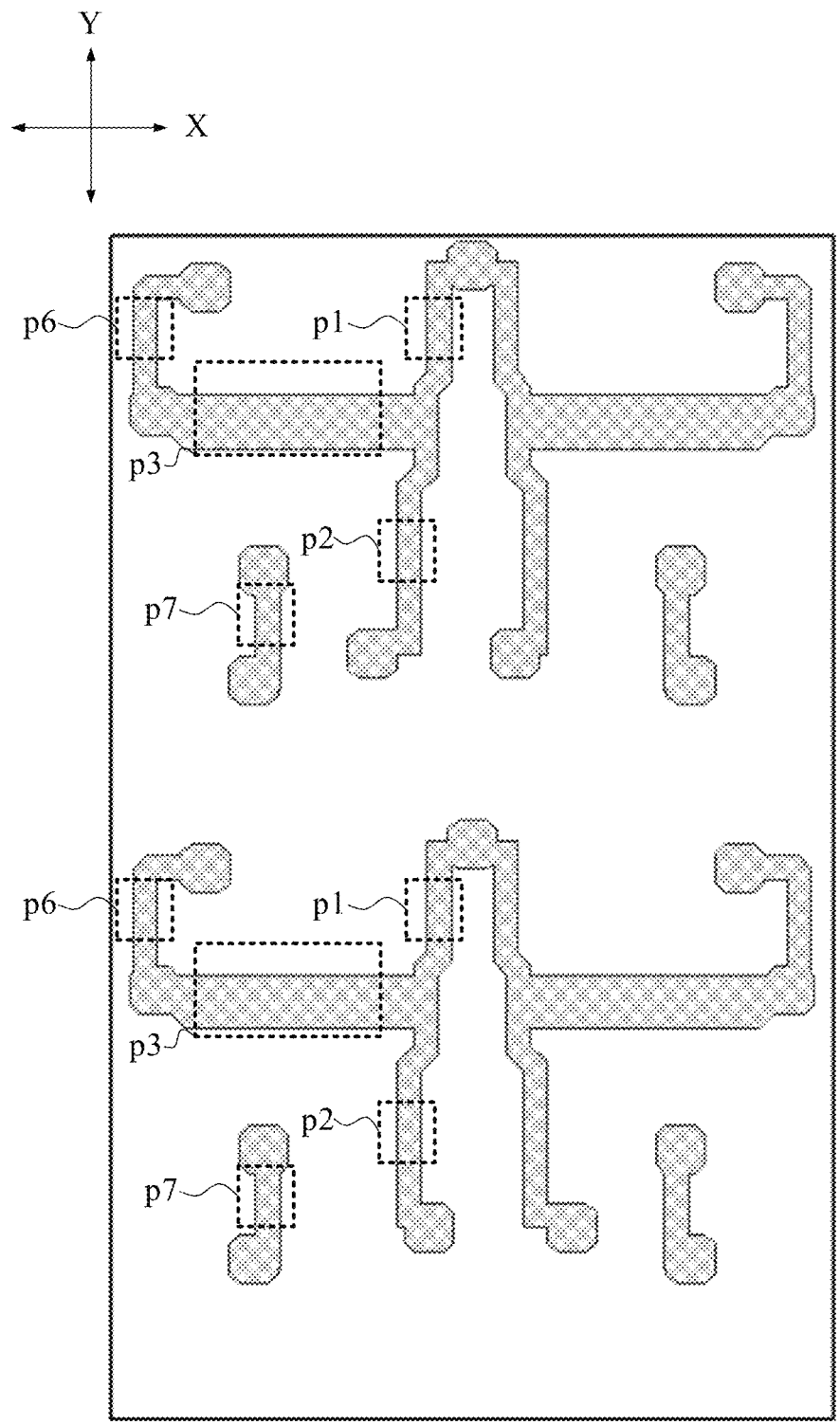
FIG. 11a is a schematic structure diagram of a layout of a first semiconductor layer as shown in FIG. 11 according to an embodiment of the present disclosure.

Reference is made to FIG. 10a in conjunction with FIG. 11a. In one embodiment, an active layer p1 of the power feeding transistor T1, an active layer p2 of the data writing transistor T2, an active layer p3 of the driving transistor T3, an active layer p6 of the light-emitting control transistor T6, and an active layer p7 of the initialization transistor T7 may be located in the same film. A material of the active layers p1, p2, p3, p6, and p7 may comprise polysilicon.

Figure 11B:
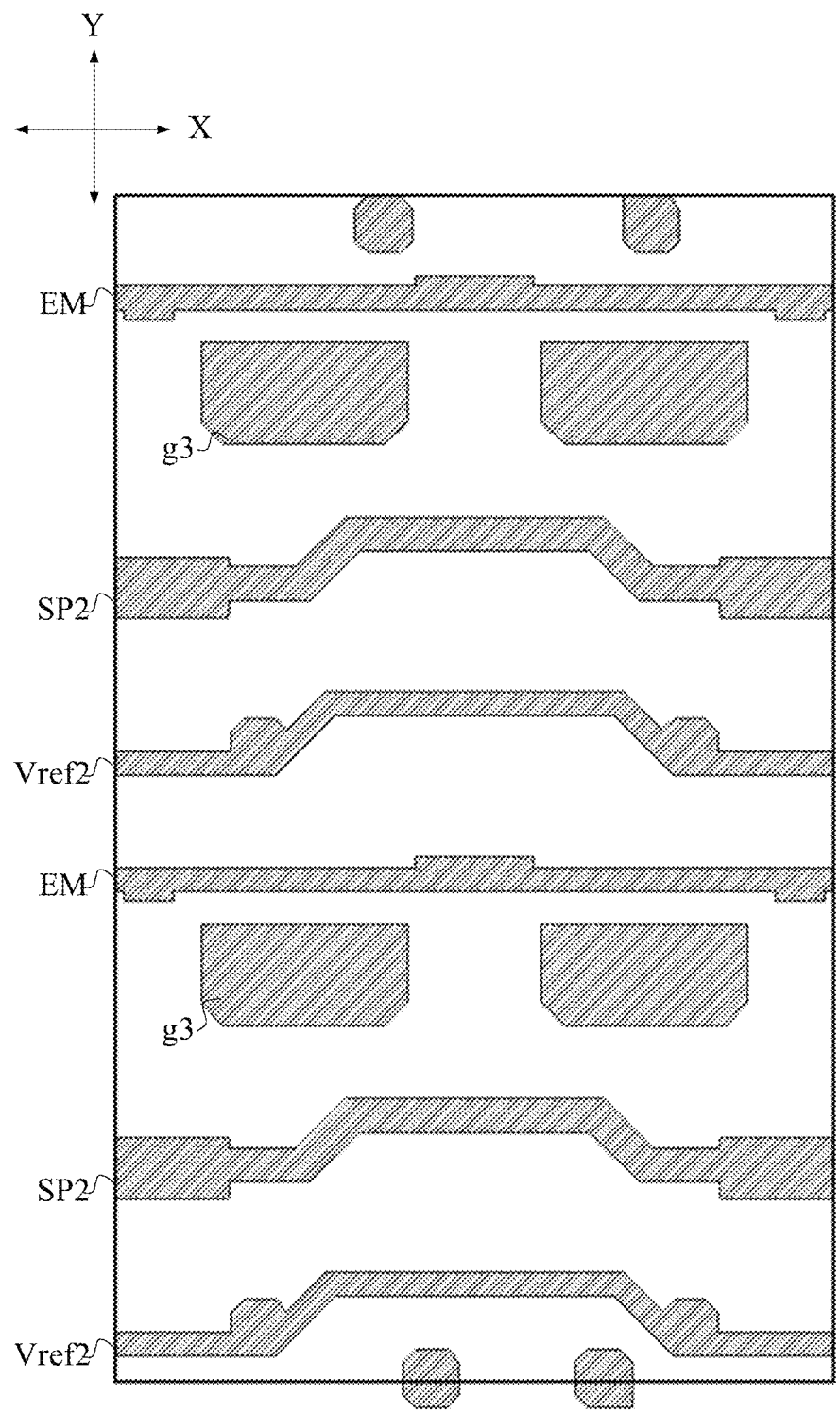
FIG. 11b is a schematic structure diagram of a layout of a first metal layer as shown in FIG. 11 according to an embodiment of the present disclosure.

Reference is made to FIG. 9 in conjunction with FIG. 11b. The gate electrode g3 of the driving transistor T3, the light-emitting control signal line EM, the scanning line SP2, and the initialization signal line Vref2 may be located in the same film. The gate electrode g3 of the driving transistor T3 may be multiplexed as a first electrode plate of the storage capacitor Cst.

Figure 11C:
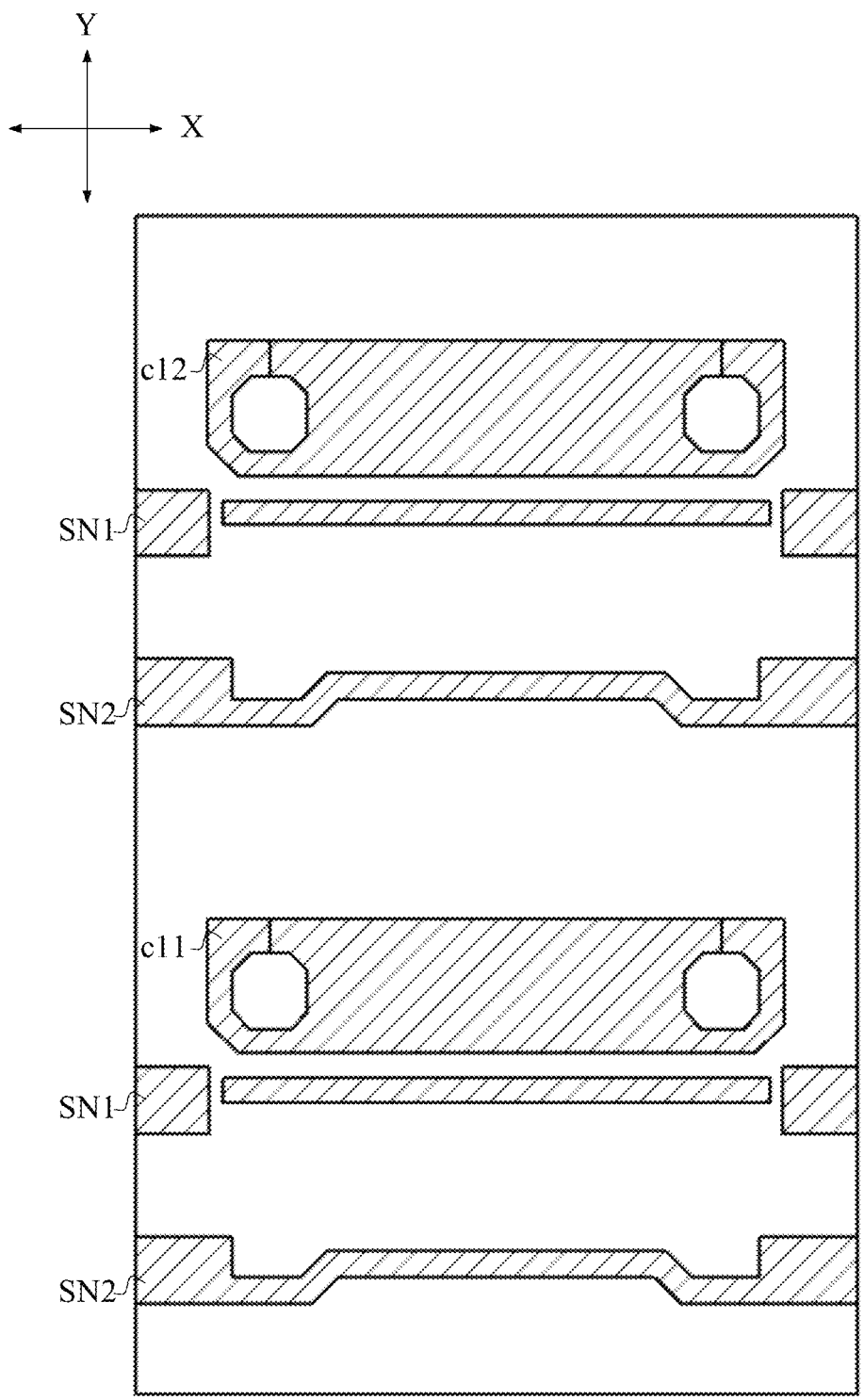
FIG. 11c is a schematic structure diagram of a layout of a capacitor metal layer as shown in FIG. 11 according to an embodiment of the present disclosure.

Reference is made to FIG. 10a in conjunction with FIG. 11c. A second electrode plate c12 of the storage capacitor Cst, the scanning line SN1, and the scanning line SN2 may be located in the same film.

Figure 11D:
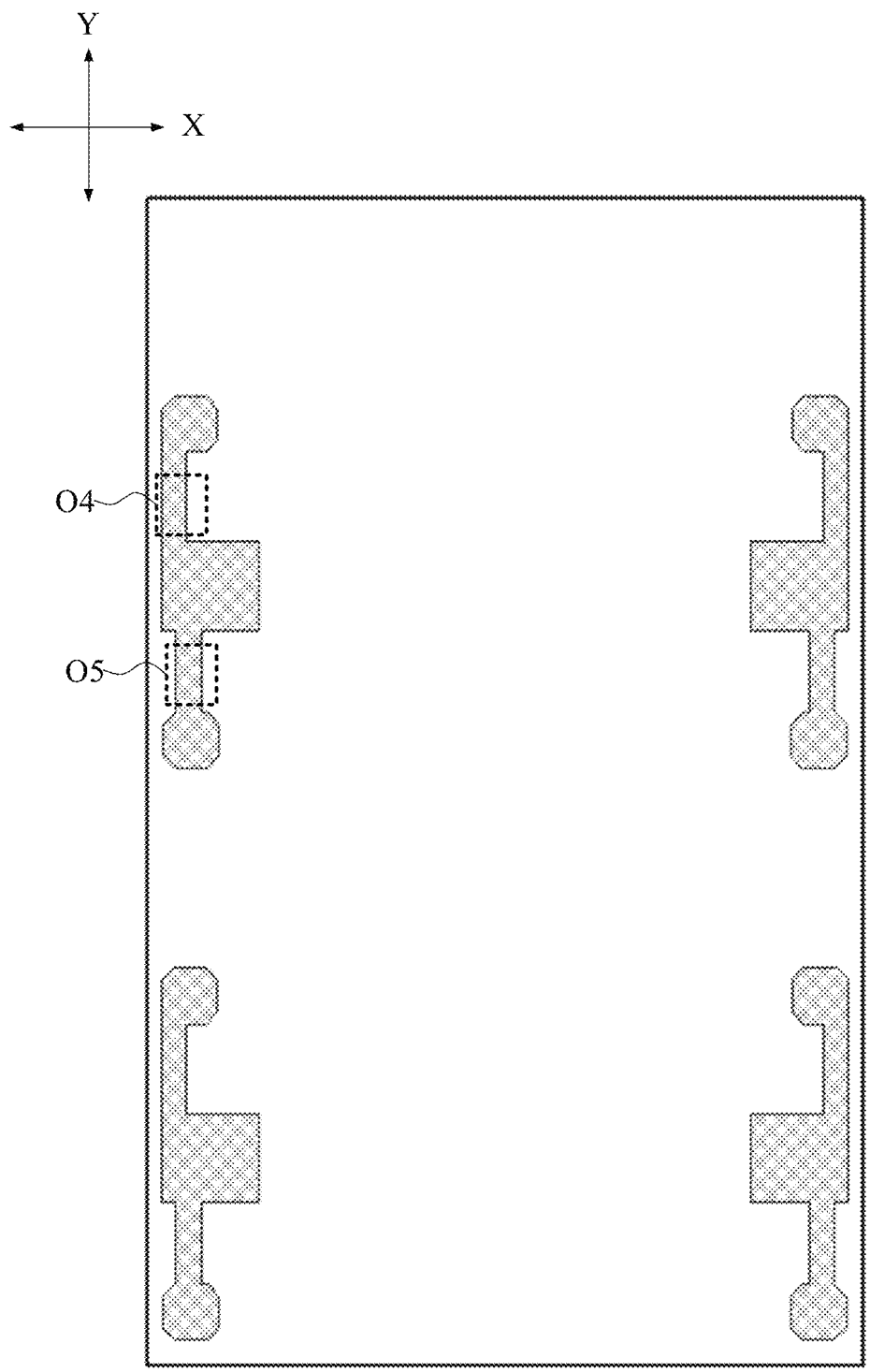
FIG. 11d is a schematic structure diagram of a layout of a second semiconductor layer as shown in FIG. 11 according to an embodiment of the present disclosure.

Reference is made to FIG. 10a in conjunction with FIG. 11d. An active layer O4 of the threshold compensating transistor T4 and an active layer O5 of the reset transistor T5 may be located in the same film. A material of the active layers O4 and O5 may comprise an oxide semiconductor.

Figure 11E:
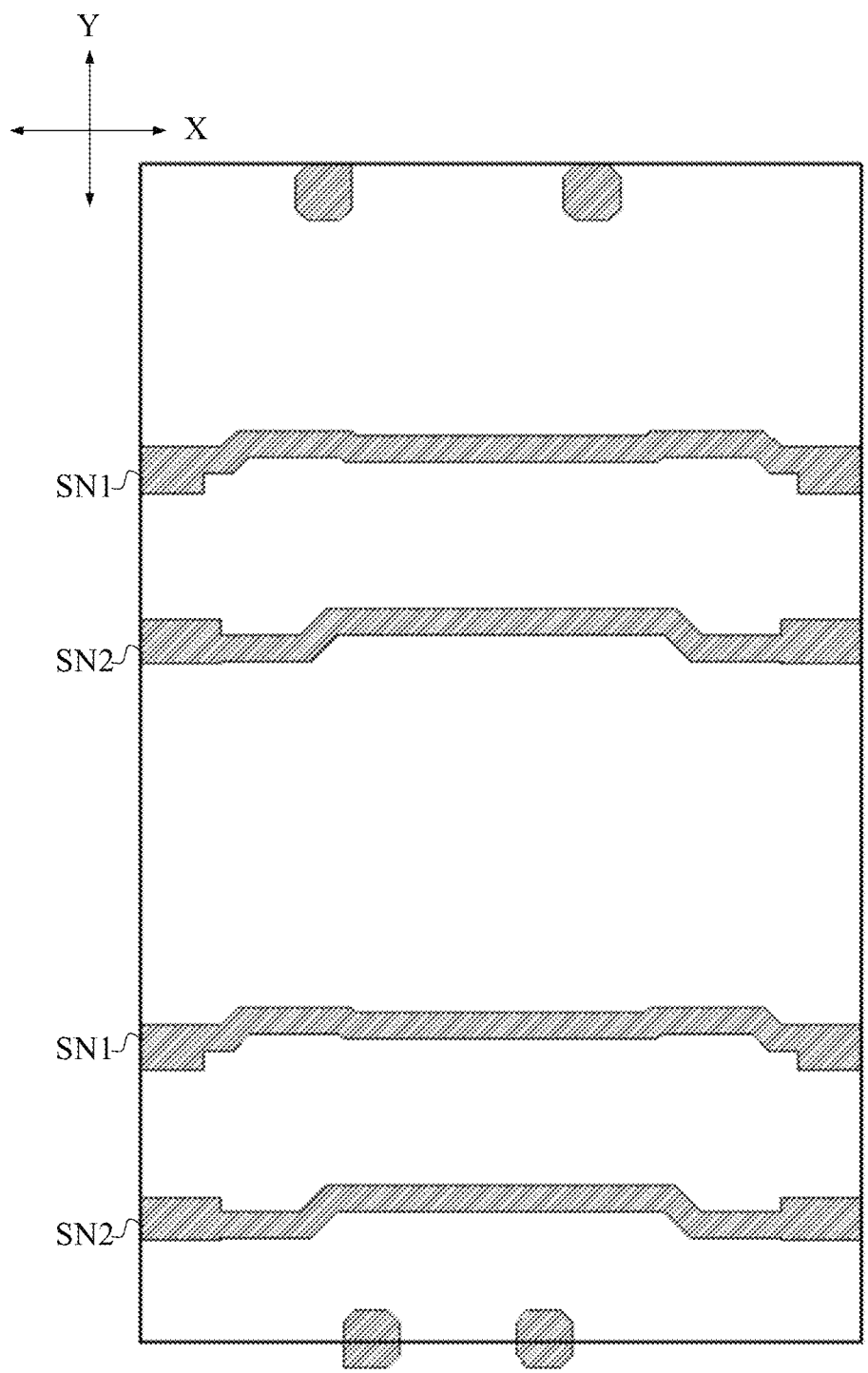
FIG. 11e is a schematic structure diagram of a layout of a gate metal layer as shown in FIG. 11 according to an embodiment of the present disclosure.

Reference is made to FIG. 10a in conjunction with FIG. 11e. The scanning line SN1 and the scanning line SN2 may be provided in another film.

Figure 11F:
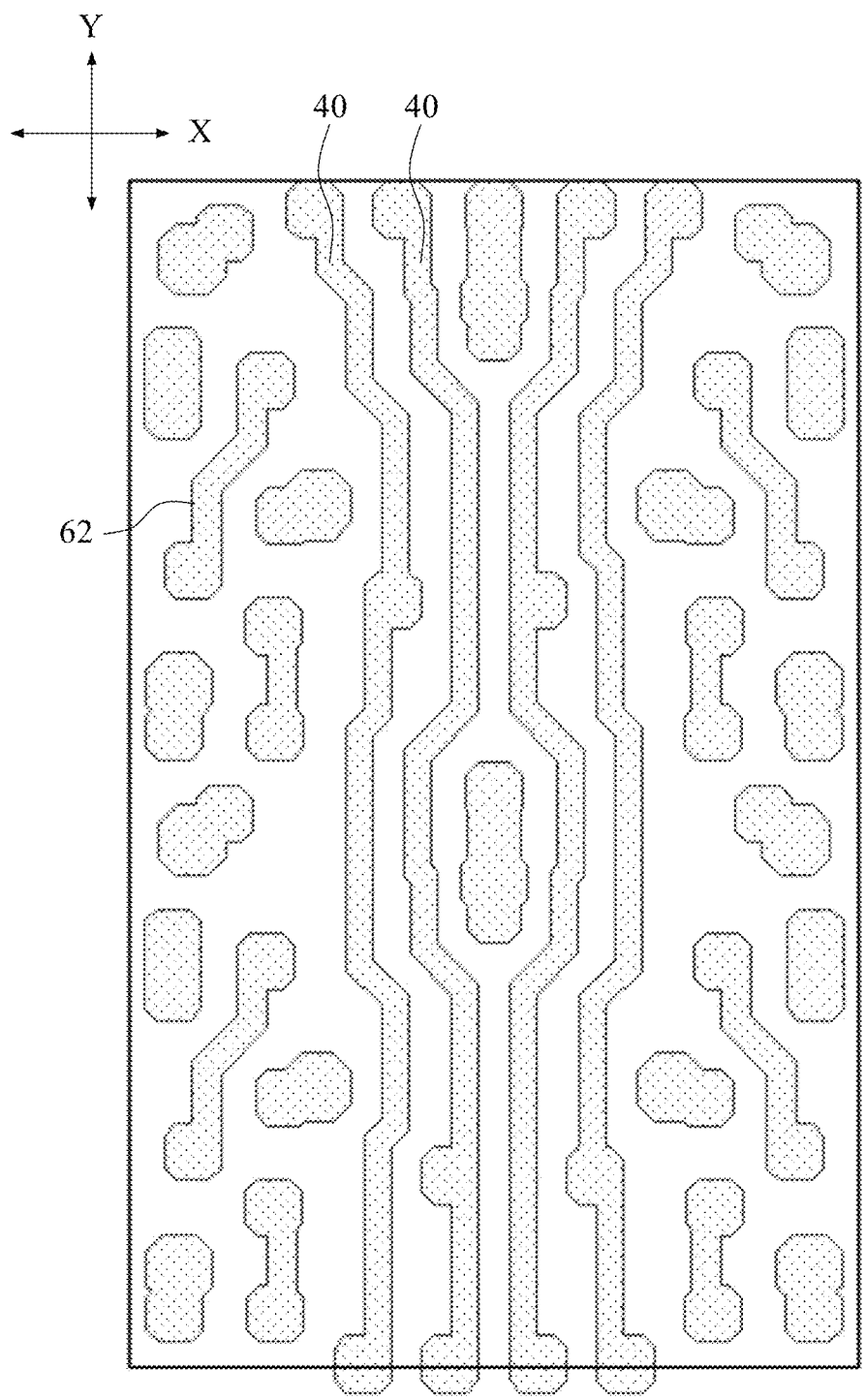
FIG. 11*f* is a schematic structure diagram of a layout of a second metal layer as shown in FIG. 11 according to an embodiment of the present disclosure.

Reference is made to FIG. 10a in conjunction with FIG. 11f. The second connection portion 62 and the data lines 40 may be located in the same film.

Figure 11G:
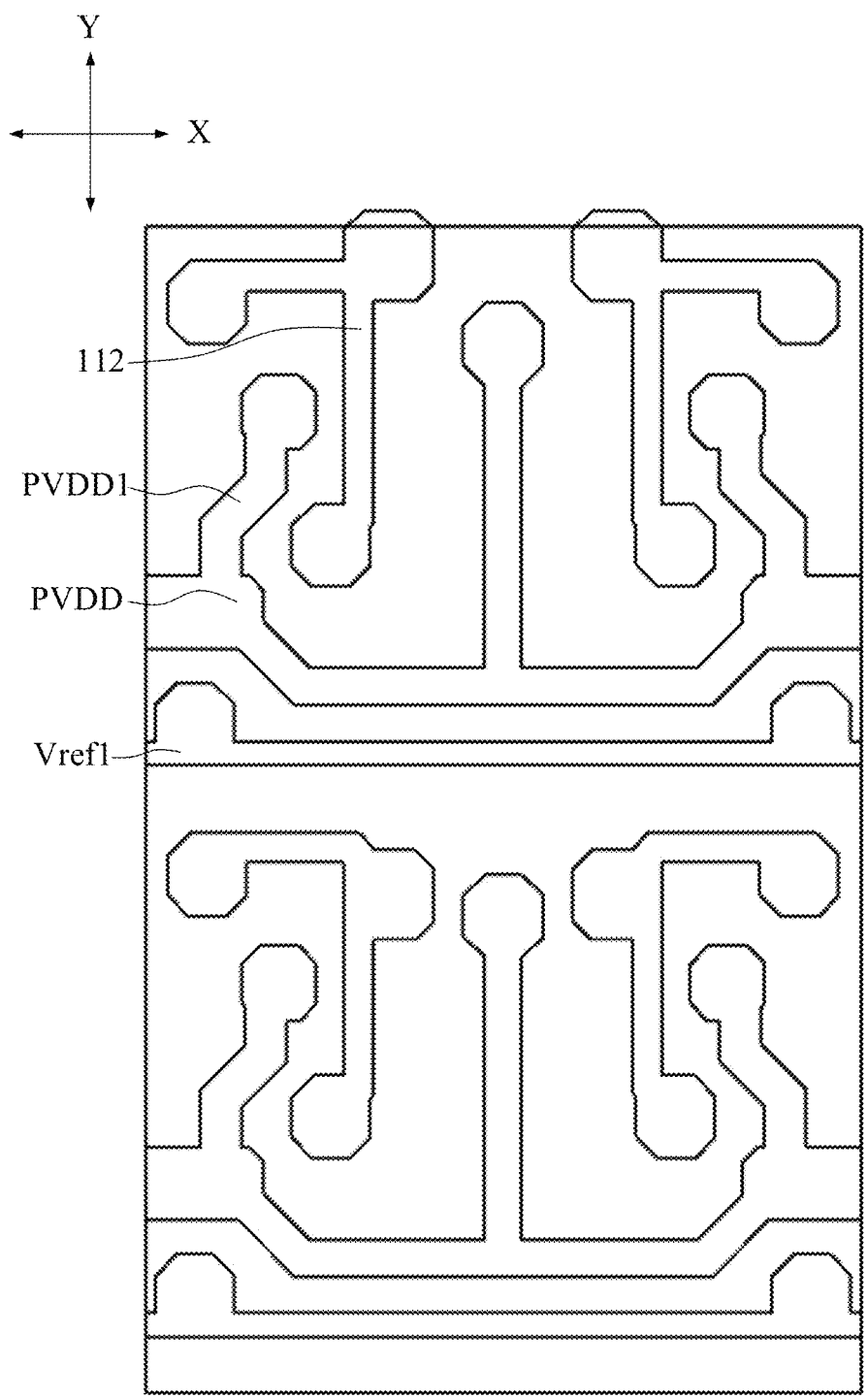
FIG. 11*g* is a schematic structure diagram of a layout of a third semiconductor layer as shown in FIG. 11 according to an embodiment of the present disclosure.

Reference is made to FIG. 10a in conjunction with FIG. 11g. The first connection portion 112 and the power line PVDD may be located in the same film. In addition, the first branch PVDD1, the reset signal line Vref1 and the power line PVDD may be located in the same film.

The structures in different films may be connected via a structure such as a through hole.

Figure 12:
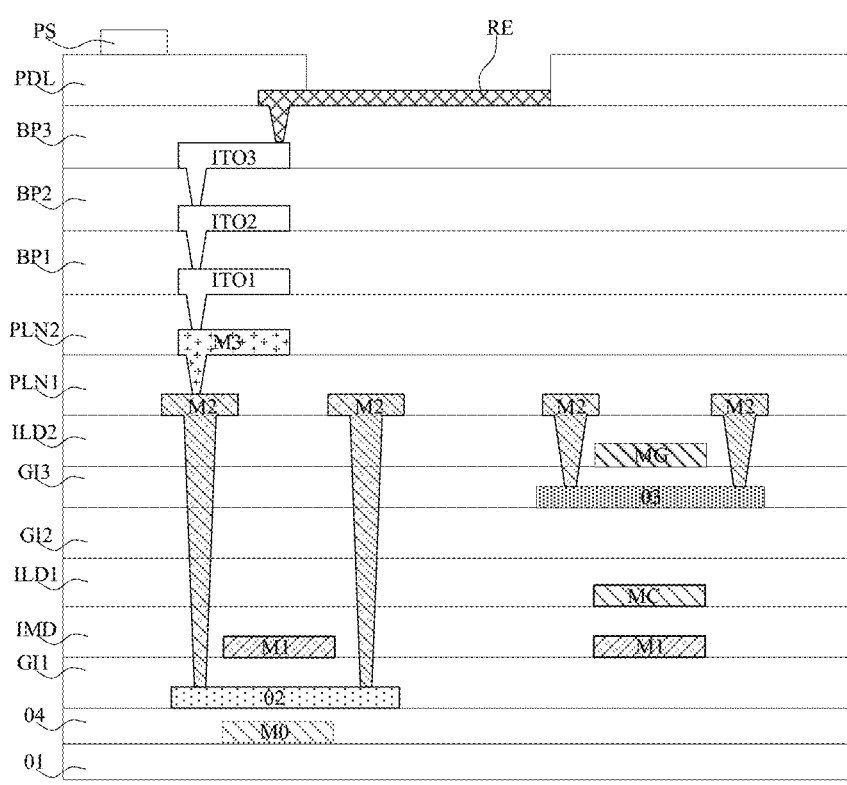
FIG. 12 is a schematic structural diagram of films of a display panel according to the embodiment of the present disclosure.

In one embodiment, as shown in FIG. 12, the display panel may comprise a substrate 01, a first semiconductor layer 02, a first metal layer M1, a capacitor metal layer MC, a second semiconductor layer 03, a gate metal layer MG, a second metal layer M2, and a third metal layer M3. The insulation layers are provided between different metal layers and between a metal layer and a semiconductor layer. For example, the insulation layers comprise GI1, IMD, ILD1, GI2, GI3, ILD2, PLN1, PLN2, and the like. Positions of each insulation layer may refer to FIG. 12.

The structure as shown in FIG. 11a may be located in the first semiconductor layer 02. The structure as shown in FIG. 11b may be located in the first metal layer M1. The structure as shown in FIG. 11c may be located in the capacitor metal layer MC. The structure as shown in FIG. 11d may be located in the second semiconductor layer 03. The structure as shown in FIG. 11e may be located in the gate metal layer MG. The structure as shown in FIG. 11f may be located in the second metal layer M2. The structure shown in FIG. 11g may be located in the third metal layer M3.

In some embodiments, as shown in FIG. 6 or FIG. 7, the third connection portion 63 may be electrically connected between the second output terminal 113 and the input terminal 511 of the first light-emitting element 51. A material of the third connection portion 63 may comprises a transparent material. The third connection portion 63 needs to extend into the first region A1, and can ensure light transmittance of the first region A1 when being made of the transparent material.

In one embodiment, as shown in FIG. 12, the display panel may further comprise at least one transparent conductive layer, which is disposed at a side of the third metal layer M3 away from the substrate 01, and the third connection portion 63 may be located in the transparent conductive layer. For example, the display panel may further comprise a first transparent conductive layer ITO1, a second transparent conductive layer ITO2, and a third transparent conductive layer ITO3, which are arranged sequentially away from the substrate 01 at a side of the third metal layer M3 away from the substrate 01.1 The third connection portion 63 may be disposed in the first transparent conductive layer ITO1, the second transparent conductive layer ITO2, and the third transparent conductive layer ITO3.

In one embodiment, the display panel further comprises insulation layers BP1, BP2, and BP3. Positions of the insulation layers BP1, BP2, and BP3 may refer to FIG. 12.

The display panel may further comprise a pixel definition layer PDL, a support pillar PS, and an anode metal layer RE, or the like.

In one embodiment, as shown in FIG. 12, the display panel may further comprise another metal layer M0 and a buffer layer 04. The metal layer M0 may comprise an auxiliary structure. The auxiliary structure is electrically connected to the power line PVDD. The auxiliary structure may overlap with at least the active layer of the drive transistor T3.

Figure 13:
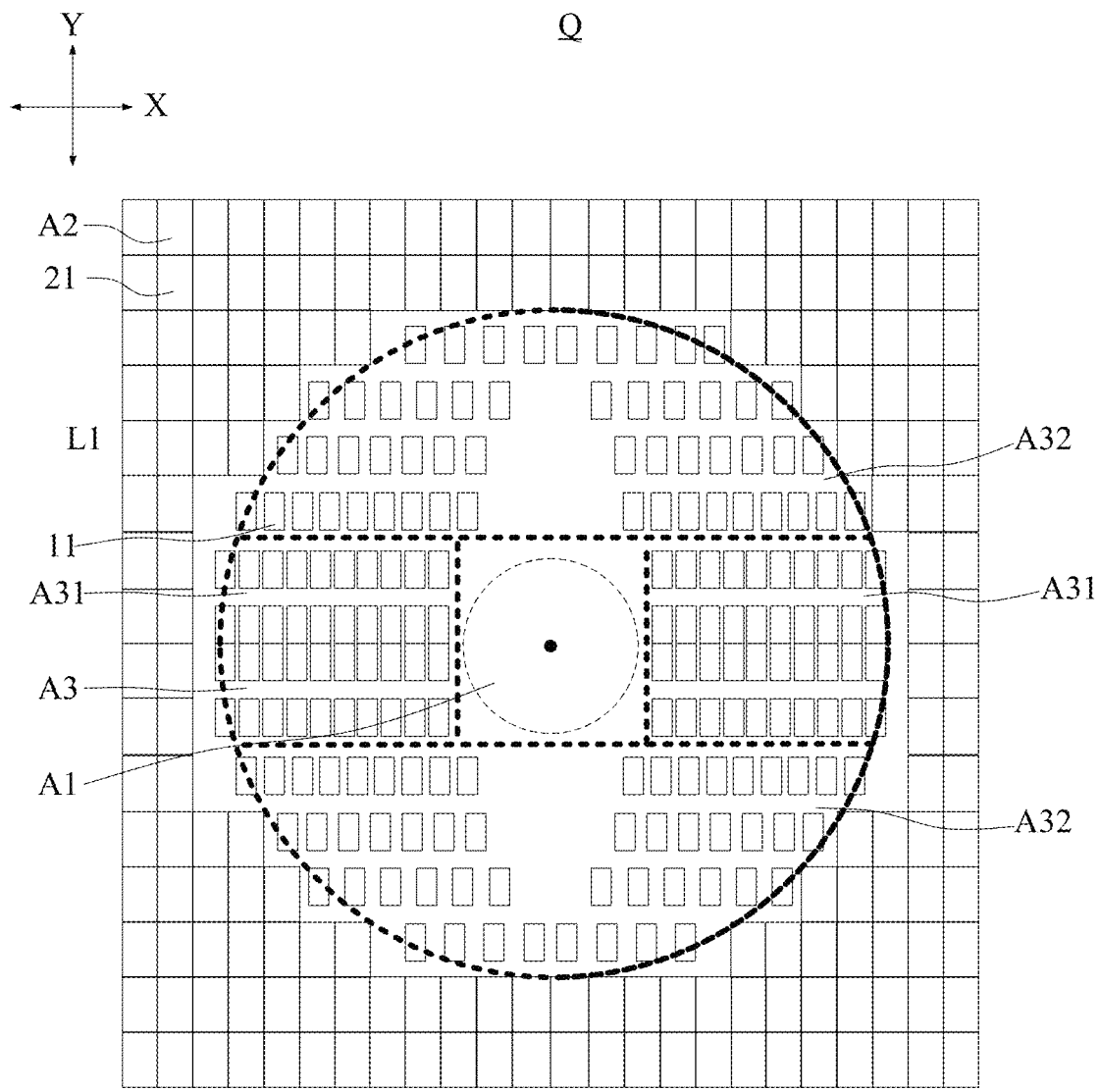
FIG. 13 is a schematic diagram of an enlarged view of region Q as shown in FIG. 1 according to another embodiment of the present disclosure.

In some embodiments, as shown in FIG. 13, the transition region A3 comprises a first transition region A31 and a second transition region A32 arranged sequentially along a direction, which is parallel to the second direction Y and points from the center of the first region A1 to the second region A2. The first driving circuits 11 which are located in the first transition region A31 and connected to the same data line are aligned with each other along the second direction Y. The first driving circuits 11 which are located in the second transition region A32 and connected to the same data line are not aligned with each other along the second direction Y. In FIG. 13, the first transition region A31 and the second transition region A32 each is indicated by a thick dotted box.

Along the second direction Y, the first transition region A31 is located at a side of the second transition region A32 facing the center of the first region A1. A quantity of second transition regions A32 may be two, and the two second transition regions A32 are located at opposite sides, respectively, of the first transition region A31 along the second direction Y.

In the first transition region A31, the first driving circuits 11 connected to the same data line are aligned with each other along the second direction Y, and the first circuit groups 10 in the first transition region A31 are arranged in a compact and regular manner. Hence, zigzags of the data lines in the first transition region A31 are reduced as much as possible.

As described above, the transition region A3 is divided into the upper half and the lower half by the virtual reference line L0, the first driving circuits 11 in the upper half are shifted downward, and the first driving circuits 11 in the lower half are shifted upward. The $m^{th}$ first circuit row H and the $(m+1)^{th}$ row first circuit row H are adjacent to each other, and are closest to the center of the first region A1 along the second direction Y. The $m^{th}$ first circuit row H in the upper half of the transition region A3 may be shifted downward, while the $(m+1)^{th}$ first circuit row H in the lower half of the transition region A3 may be shifted upward. The maximum extend of the above shifting may be that a lower edge of the $m^{th}$ first circuit row H in the upper half of the transition region A3 abut against an upper edge of the $(m+1)^{th}$ first circuit row H in the lower half of the transition region A3.

The $m^{th}$ and the $(m+1)^{th}$ first circuit rows H are located in the first transition region A31. Hence, among the $m^{th}$ and the $(m+1)^{th}$ first circuit rows H, the first driving circuits 111 connected to the same data line are aligned with each other along the second direction Y, and the data line may not have the portion extend along the first direction X. Therefore, the alignment between the lower edge of the $m^{th}$ first circuit row H and the upper edge of the $(m+1)^{th}$ first circuit row H does not affect arrangement of the data lines.

Figure 14:
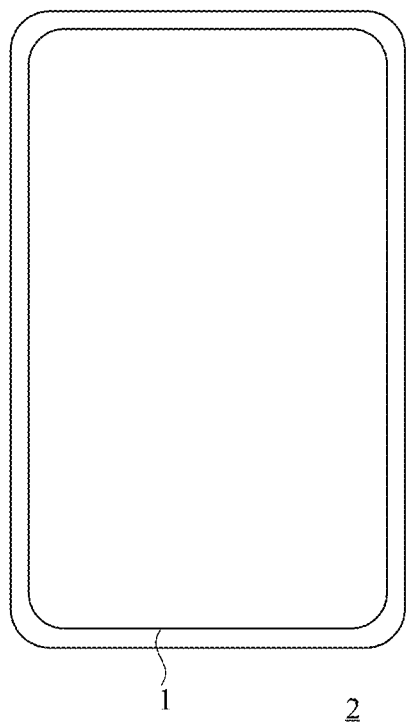
FIG. 14 is a schematic structural diagram of a display device according to an embodiment of the present disclosure.

Based on the embodiments, a display device is further provided according to an embodiment of the present disclosure. The display device comprises the display panel according to any foregoing embodiment. Reference is made to FIG. 14, which is a schematic structural diagram of a display device according to an embodiment of the present disclosure. The display device 2 as shown in FIG. 14 comprises the display panel 1 according to any foregoing embodiment. In FIG. 14, a mobile phone is taken only as an example for illustrating the display device 2, and the display device may be another device having a display function, such as a wearable product, a computer, a television, a vehicle-mounted display, which is not limited herein. The display device provided herein also has the beneficial effects of the display panel provided herein. Details of the display device may refer to the description of the foregoing display panel, and are not repeated herein.

Hereinabove embodiments of the present disclosure do not illustrate all details exhaustively, and the present disclosure shall not be construed as these embodiments only. It is appreciated that various modifications and changes may be made on a basis of the above description. The embodiments are selected and illustrated herein for explaining principles and practical applications of the present disclosure better. The present disclosure is only subject to the appended claims, as well as a full scope and equivalents of the claims.

The invention claimed is:

1. A display panel, comprising:
    a first region, a second region, and a transition region disposed between the first region and the second region, wherein light transmittance of the first region is greater than light transmittance of the second region; wherein the display panel comprises:
        a plurality of first driving circuits, disposed in the transition region and arranged in an array along a first direction and a second direction which are not parallel; and
        a plurality of second driving circuits, disposed in the second region and arranged in another array along the first direction and the second direction;
    wherein one or more first driving circuits of the plurality of first driving circuits and one or more second driving circuits of the plurality of second driving circuits are electrically connected to a same gate-signal line; and
    wherein along the second direction, a distance d11 between a center of a first driving circuit of the one or more first driving circuits and a center of the first region is smaller than a distance d12 between a center of a second driving circuit of the one or more second driving circuits and the center of the first region.

2. The display panel according to claim 1, wherein:
    each of at least one first driving circuit of the plurality of first driving circuits comprises a first output terminal and a first connection portion which are connected;
    at least a portion of the first connection portion extends along the second direction, and the first connection portion comprises a second output terminal;
    a first light-emitting element is disposed in the first region, the first light-emitting element comprises an input terminal, and the second output terminal is electrically connected to the input terminal.

3. The display panel according to claim 1, wherein:
    along the second direction, a length a of a first driving circuit of the one or more first driving circuits in the second direction is smaller than a length b of a second driving circuit of the one or more second driving circuits, and there is $d12-d11 \le (b-a)/2$.

4. The display panel according to claim 1, wherein along one or both of the first direction and the second direction, a length of a first driving circuit of the one or more first driving circuits in the second direction is smaller than a length of a first driving circuit of the one or more second driving circuits.

5. The display panel according to claim 2, wherein:
    first driving circuits of the plurality of first driving circuits form first circuit rows extending along the first direction, and the first circuit rows are sequentially numbered from a first row to an n-th row along the second direction, wherein n is an integer;
    along the second direction, a distance between the second output terminal of a first driving circuit, of the at least one first driving circuit, in the k-th row and the input terminal of the first light-emitting element connected to the first driving circuit is equal to d21, and a distance between the second output terminal of another first driving circuit, of the at least one first driving circuit, in the s-th row and the input terminal of the first light-emitting element connected to the another first driving circuit is equal to d22, wherein k and s each is an integer ranging from 1 to n, and k is not equal to s; and d21 is equal to d22.

6. The display panel according to claim 2, wherein:
    the plurality of first driving circuits comprises an i1-th row of first driving circuits and an i2-th row of first driving circuits, and the i1-th row of first driving circuits and the i2-th row of first driving circuits are connected to different gate-signal lines;
    the i1-th row of first driving circuits is connected to the input terminal of the first light-emitting element in an m1-th row of first light-emitting elements, the i2-th row of first driving circuits is connected to the input terminal of the first light-emitting element in an m2-th row of first light-emitting elements, wherein i1, i2, m1, and m2 each is an integer, i1 is not equal to i2, and m1 is not equal to m2; and
    along the second direction, a distance between the second output terminal of a first driving circuit in the i1-th row of first driving circuits and the second output terminal of a first driving circuit in the i2-th row of first driving circuits is equal to d31, and a distance between the input terminal of the first light-emitting element in an m1-th row of first light-emitting elements and the input terminal of the first light-emitting element in an m2-th row of first light-emitting elements is equal to d32; and d31 is equal to d32.

7. The display panel according to claim 6, wherein:
    the i1-th row of first driving circuits and the i2-th row of first driving circuits are adjacent rows among the plurality of first driving circuits along the second direction;
    the plurality of second driving circuits comprises a j1-th row of second driving circuits and a j2-th row of second driving circuits, and the j1-th row of second driving circuits and the j2-th row of second driving circuits are adjacent rows among the plurality of second driving circuits;

the j1-th row of second driving circuits and the i1-th row of first driving circuits are connected to a gate-signal line, and the j2-th row of second driving circuits and the i2-th row of first driving circuits are connected are connected to another gate-signal line; and along a second direction, a distance between an output terminal of a second driving circuit in the j1-th row of second driving circuits and an output terminal of a second driving circuit in the j2-th row of second driving circuits is equal to d34, and d31 is equal to d34.

8. The display panel according to claim 6, wherein a relative position of the second output terminal of the first driving circuit in the i1-th row of first driving circuits with respect to the first connection portion in the first driving circuit in the i1-th row of first driving circuits is different from a relative position of the second output terminal of the first driving circuit in the i2-th row of first driving circuits with respect to the first connection portion in the first driving circuit in the i2-th row of first driving circuits.

9. The display panel according to claim 8, wherein:
along the second direction, a terminal of the first connection portion close to the center of the first region is a first terminal;
along the second direction, the i1-th row of first driving circuits is closer to the center of the first region than the i2-th row of first driving circuits; and
along the second direction, a distance between the first terminal and the second output terminal in the first driving circuit in the i1-th row of first driving circuits is smaller than a distance between the first terminal and the second output terminal in the first driving circuit in the i2-th row of first driving circuits.

10. The display panel according to claim 2, wherein an orthographic projection of the first connection portions on a light-emitting surface of the display panel is same throughout the plurality of first driving circuits.

11. The display panel according to claim 10, wherein:
two first driving circuits, which neighbor along the first direction among the plurality first driving circuits, are symmetrical in a pattern of the first connection portion.

12. The display panel according to claim 2, wherein:
the first driving circuit comprises a light-emitting control transistor and an initialization transistor;
the first output terminal comprises a first output sub-terminal and a second output sub-terminal; and
the light-emitting control transistor is connected to the first output sub-terminal, the initialization transistor is connected to the second output sub-terminal, and the first connection portion is electrically connected between the first output sub-terminal and the second output sub-terminal.

13. The display panel according to claim 12, wherein:
the first connection portion comprises a first section and a second section that are connected;
the first section is electrically connected to the first output sub-terminal, and the second section is electrically connected to the second output sub-terminal; and
the first section extends along the first direction, and the second section extends along the second direction.

14. The display panel according to claim 2, wherein:
the display panel further comprises a data line electrically connected to the plurality of first driving circuit;
the first connection portion and the data lines are located in different films.

15. The display panel according to claim 14, wherein a thickness of an insulation layer between the first connection portion and the data lines is greater than or equal to 2 um.

16. The display panel according to claim 2, wherein:
the display panel further comprises a power line electrically connected to the plurality of first driving circuits;
a first driving circuit of the plurality of first driving circuit further comprises a driving transistor and a second connection portion, and the second connection portion is electrically connected to a gate electrode of the driving transistor; and
the power line comprises a first branch, and an orthographic projection of the first branch on a light-emitting surface of the display panel overlaps at least partially with an orthographic projection of the second connection portion on the light-emitting surface of the display panel.

17. The display panel according to claim 16, wherein the first connection portion and the power line are located on a same film.

18. The display panel according to claim 2, wherein:
the display panel further comprises a third connection portion electrically connected between the second output terminal and the input terminal; and
the third connection portion comprises a transparent material.

19. The display panel according to claim 1, wherein:
the transition region comprises a first transition region and a second transition region, which are sequentially arranged along the second direction, and the first transition region is located at a side of the second transition region facing the center of the first region;
among the plurality of first driving circuits, first driving circuits which are in the first transition region and connected to a same data line are aligned with a same position along the second direction; and
among the plurality of first driving circuits, first driving circuits which are in the second transition region and connected to a same data line are not aligned with a same position along the second direction.

20. A display device, comprising a display panel, wherein the display panel comprises:
a first region, a second region, and a transition region disposed between the first region and the second region, wherein light transmittance of the first region is greater than light transmittance of the second region;
wherein the display panel comprises:
a plurality of first driving circuits, disposed in the transition region and arranged in an array along a first direction and a second direction which are not parallel; and
a plurality of second driving circuits, disposed in the second region and arranged in another array along the first direction and the second direction;
wherein one or more first driving circuits of the plurality of first driving circuits and one or more second driving circuits of the plurality of second driving circuits are electrically connected to a same gate-signal line; and
wherein along the second direction, a distance d11 between a center of a first driving circuit of the one or more first driving circuits and a center of the first region is smaller than a distance d12 between a center of a second driving circuit of the one or more second driving circuits and the center of the first region.

* * * * *